US012804821B2

(12) United States Patent
Terauchi

(10) Patent No.: US 12,804,821 B2
(45) Date of Patent: Nov. 17, 2026

(54) METHOD FOR MANUFACTURING WIRING SUBSTRATE

(71) Applicant: IBIDEN CO., LTD., Ogaki (JP)

(72) Inventor: Ikuya Terauchi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 594 days.

(21) Appl. No.: 18/489,884

(22) Filed: Oct. 19, 2023

(65) Prior Publication Data

US 2024/0138076 A1 Apr. 25, 2024
US 2024/0237231 A9 Jul. 11, 2024

(30) Foreign Application Priority Data

Oct. 20, 2022 (JP) ................................ 2022-168667

(51) Int. Cl.
*H05K 3/40* (2006.01)
*H05K 3/00* (2006.01)

(52) U.S. Cl.
CPC ......... *H05K 3/4038* (2013.01); *H05K 3/0055* (2013.01); *H05K 3/4007* (2013.01); *H05K 2203/107* (2013.01)

(58) Field of Classification Search
CPC .. H05K 3/4038; H05K 3/0055; H05K 3/4007; H05K 2203/107; H05K 3/244; H05K 3/0035; H05K 3/4644; H05K 3/0026; H05K 2201/09509; H05K 1/115; Y10T 29/49156
See application file for complete search history.

(56) References Cited

U.S. PATENT DOCUMENTS 8,338,718 B2 * 12/2012 Kaneko ................ H05K 3/4007 174/267
9,613,893 B2 * 4/2017 Terui .................... H05K 3/4694
9,867,296 B2 * 1/2018 Kim ..................... H05K 3/4007

FOREIGN PATENT DOCUMENTS

JP 2016-058472 A 4/2016

* cited by examiner

*Primary Examiner* — Donghai D Nguyen
(74) *Attorney, Agent, or Firm* — Finnegan, Henderson, Farabow, Garrett & Dunner, LLP

(57) ABSTRACT

A method for manufacturing a wiring substrate includes forming first conductor pads and second conductor pads having a shorter inter-pad distance than the first conductor pads, forming a second insulating layer covering the first conductor pads and the second conductor pads, forming first via holes exposing the first conductor pads, applying a first desmear treatment such that residues are removed from the first via holes, forming second via holes in the second insulating layer after the first desmear treatment such that the second via holes expose the second conductor pads, applying a second desmear treatment such that residues are removed from the second via holes, forming first via conductors in the first via holes such that the first via conductors are formed on the first conductor pads, and forming second via conductors in the second via holes such that the second via conductor are formed on the second conductor pads.

20 Claims, 23 Drawing Sheets

METHOD FOR MANUFACTURING WIRING SUBSTRATE

CROSS-REFERENCE TO RELATED APPLICATIONS

The present application is based upon and claims the benefit of priority to Japanese Patent Application No. 2022-168667, filed Oct. 20, 2022, the entire contents of which are incorporated herein by reference.

BACKGROUND OF THE INVENTION

Field of the Invention

The present invention relates to a method for manufacturing a wiring substrate.

Description of Background Art

Japanese Patent Application Laid-Open Publication No. 2016-58472 describes a method for manufacturing a wiring substrate. The entire contents of this publication are incorporated herein by reference.

SUMMARY OF THE INVENTION

According to one aspect of the present invention, a method for manufacturing a wiring substrate includes forming, on a surface of an insulating layer, first conductor pads and second conductor pads having an inter-pad distance that is shorter than an inter-pad distance of the first conductor pads, forming a second insulating layer on the surface of the insulating layer such that the second insulating layer covers the surface of the insulating layer, the first conductor pads and the second conductor pads, forming first via holes in the second insulating layer such that the first via holes expose the first conductor pads formed on the surface of the insulating layer, respectively, applying a first desmear treatment to the second insulating layer such that residues are removed from the first via holes formed in the second insulating layer, forming second via holes in the second insulating layer after the first desmear treatment such that the second via holes expose the second conductor pads formed on the surface of the insulating layer, applying a second desmear treatment to the second insulating layer such that residues are removed from the second via holes formed in the second insulating layer, forming first via conductors in the first via holes formed in the second insulating layer such that the first via conductors are formed on the first conductor pads, respectively, and forming second via conductors in the second via holes formed in the second insulating layer such that the second via conductor are formed on the second conductor pads, respectively.

According to another aspect of the present invention, a method for manufacturing a wiring substrate includes forming, on a surface of an insulating layer, first conductor pads and second conductor pads having an inter-pad distance that is shorter than an inter-pad distance of the first conductor pads, forming a second insulating layer on the surface of the insulating layer such that the second insulating layer covers the surface of the insulating layer, the first conductor pads and the second conductor pads, forming first via holes in the second insulating layer such that the first via holes expose the first conductor pads formed on the surface of the insulating layer, respectively, applying a first desmear treatment to the second insulating layer such that residues are removed from the first via holes formed in the second insulating layer, forming first via conductors in the first via holes formed in the second insulating layer such that the first via conductors are formed on the first conductor pads, respectively, forming third conductor pads on a surface of the second insulating layer such that the third conductor pads connect to the first via conductors, respectively, forming a third insulating layer on the second insulating layer such that the third insulating layer covers the surface of the second insulating layer and the third conductor pads, forming third via holes in the third insulating layer such that the third via holes expose the third conductor pads formed on the surface of the second insulating layer, respectively, applying a third desmear treatment to the third insulating layer such that residues are removed from the third via holes formed in the third insulating layer, forming second via holes in the second insulating layer and the third insulating layer such that the second via holes expose the second conductor pads formed on the of the insulating layer, respectively, applying a second desmear treatment to the second insulating layer and the third insulating layer such that a processing time of the second desmear treatment is shorter than a processing time of the third desmear treatment and that residues are removed from the second via holes formed in the second insulating layer and the third insulating layer, forming third via conductors in the third via holes formed in the third insulating layer such that the third via conductors are formed on the third conductor pads, respectively, and forming second via conductors in the second via holes formed in the second insulating layer and the third insulating layer such that the second via conductors are formed on the second conductor pads, respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
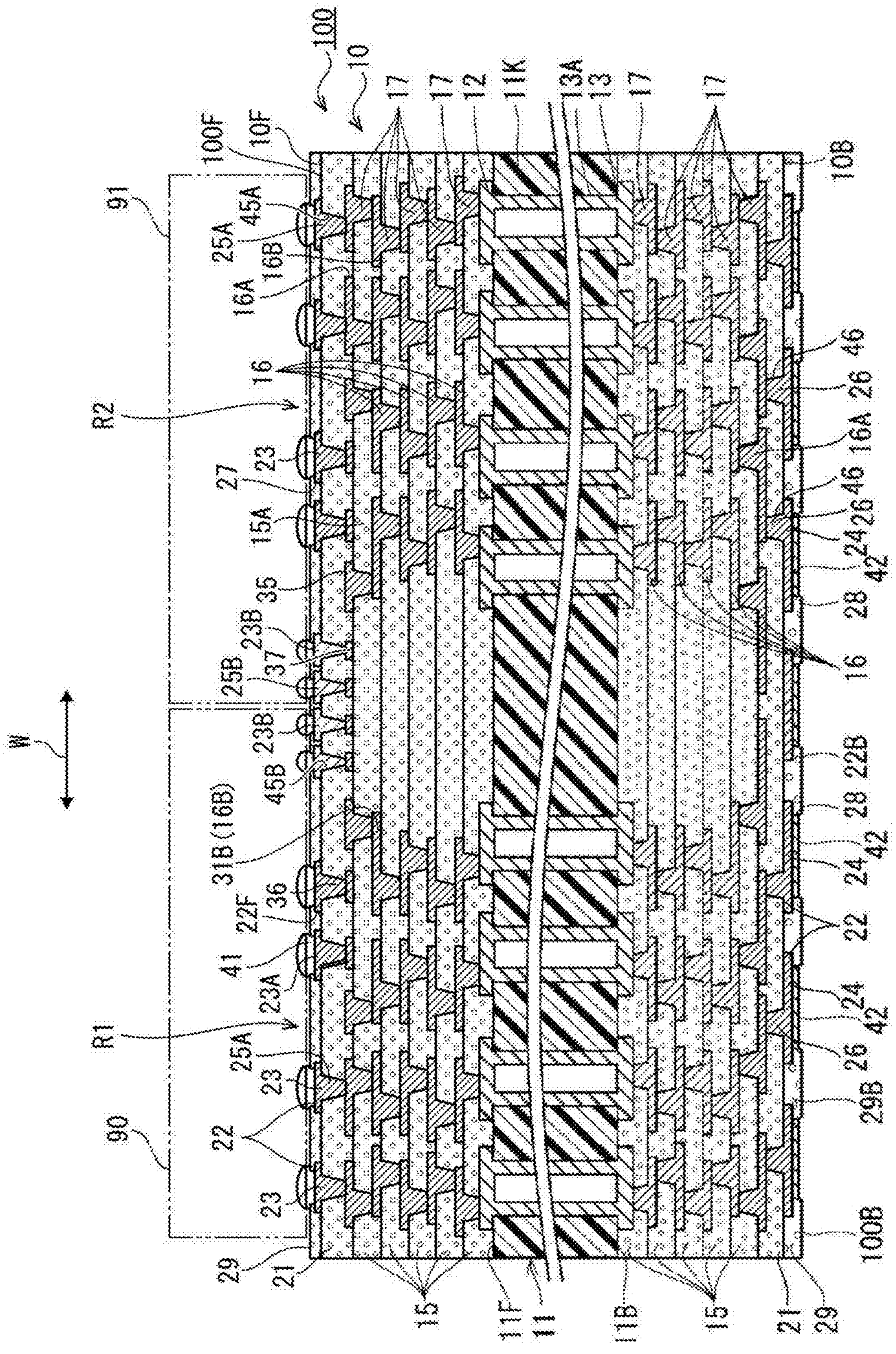
FIG. 1 is a cross-sectional view illustrating a wiring substrate of a first embodiment of the present invention.

Embodiments will now be described with reference to the accompanying drawings, wherein like reference numerals designate corresponding or identical elements throughout the various drawings.

A wiring substrate manufactured using a method for manufacturing a wiring substrate of a first embodiment of the present invention is a wiring substrate that includes multiple first conductor pads and multiple second conductor pads as conductor pads internally provided. The multiple first conductor pads have a relatively long inter-pad distance between the first conductor pads, whereas the multiple second conductor pads have a relatively short inter-pad distance between the second conductor pads. In the following, the wiring substrate of the first embodiment is simply referred to as a wiring substrate 100.

Figure 2:
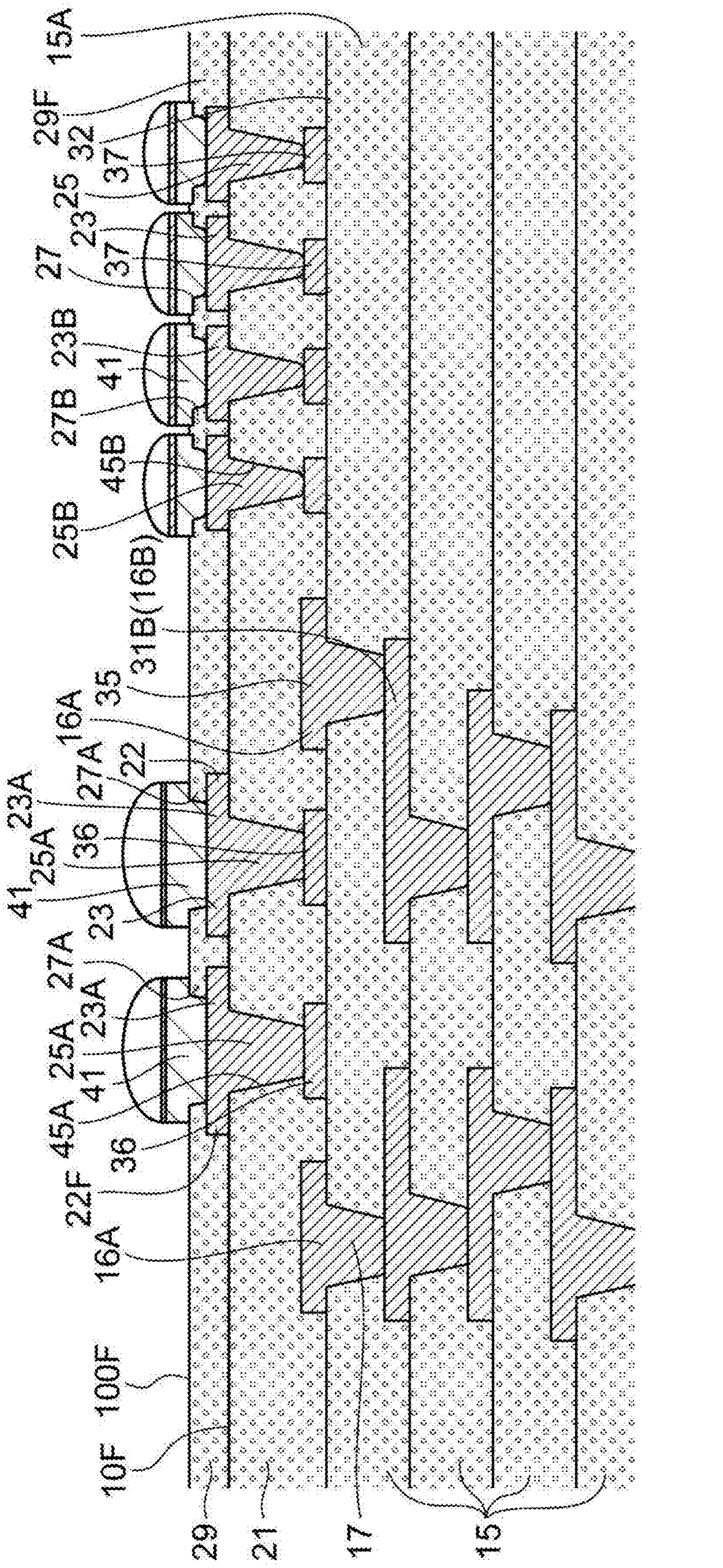
FIG. 2 is a partially enlarged cross-sectional view illustrating the wiring substrate according to an embodiment of the present invention.
Figure 3:
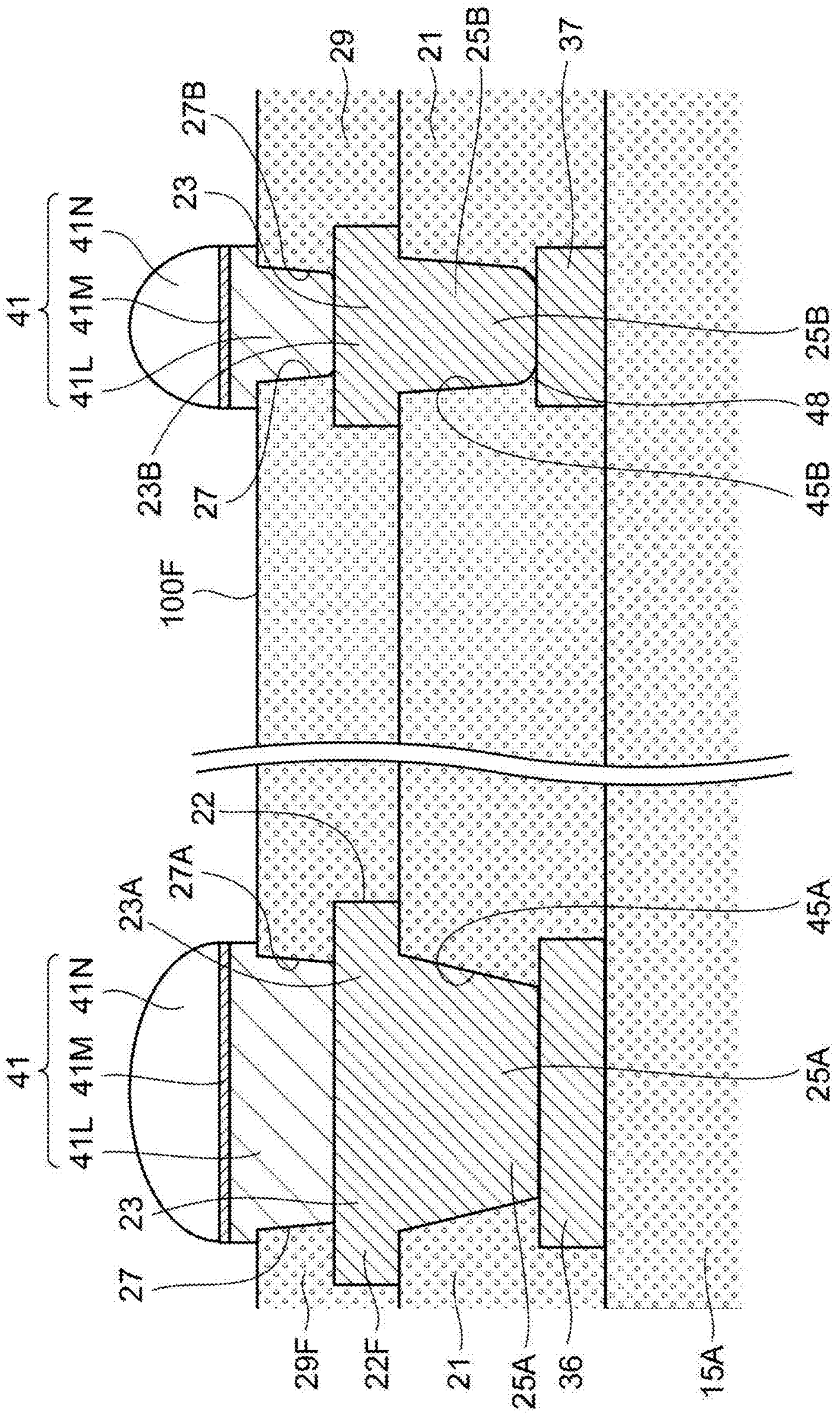
FIG. 3 is a further partially enlarged cross-sectional view illustrating the wiring substrate according to an embodiment of the present invention.

FIG. 1 is a cross-sectional view illustrating the wiring substrate 100 manufactured using a method for manufacturing a wiring substrate according to the first embodiment of the present invention. FIG. 2 is an enlarged cross-sectional view of a part of the wiring substrate 100 illustrated in FIG. 1. FIG. 3 is a further enlarged cross-sectional view of a part of the wiring substrate 100 illustrated in FIG. 2. The wiring substrate 100 is an example of a wiring substrate according to an embodiment of the present invention.

Of both sides of the wiring substrate 100 in a thickness direction, an upper surface in FIG. 1 is a first surface (100F), and a lower surface is a second surface (100B). Further, for convenience, the first surface (100F) side may be referred to as an upper side, and the second surface (100B) side may be referred to as a lower side. However, the orientation of the wiring substrate 100 in each drawing does not limit an actual usage state of the wiring substrate 100.

As illustrated in FIG. 1, the wiring substrate 100 has a main body substrate 10. Further, the main body substrate 10 has a core substrate 11, multiple build-up insulating layers 15, and multiple build-up conductor layers 16.

The core substrate 11 is positioned at a center portion of the wiring substrate 100 in the thickness direction. The multiple build-up insulating layers 15 and the multiple build-up conductor layers 16 are laminated on an upper side and a lower side of the core substrate 11.

The core substrate 11 has an insulating base material (11K). In the present embodiment, the insulating base material (11K) is formed of an epoxy resin or a BT (bismaleimide triazine) resin and a reinforcing material such as a glass cloth. An upper surface of the insulating base material (11K) is a first surface (11F) of the core substrate 11, and a lower surface of the insulating base material (11K) is a second surface (11B) of the core substrate 11. As an example, the core substrate 11 has a thickness of 500 μm or more and 1,200 μm or less.

A copper foil (not illustrated) is laminated on the first surface (11F) and the second surface (11B) of the core substrate 11.

Core conductors 12 are formed on the first surface (11F) and the second surface (11B) of the core substrate 11. As an example, the core conductors 12 each have a thickness of 20 μm or more and 500 μm or less.

Multiple through holes (13A) are formed in the insulating base material (11K). The multiple through holes (13A) each penetrate the insulating base material (11K) in the thickness direction. Through-hole conductors 13 are formed on wall surfaces of the through holes (13A) by, for example, copper plating. The core conductors 12 on the first surface (11F) and the core conductors 12 on the second surface (11B) are connected by the through-hole conductors 13.

The multiple build-up insulating layers 15 and the multiple build-up conductor layers 16 are alternately laminated on the first surface (11F) and the second surface (11B) of the core substrate 11. That is, the main body substrate 10 is a multilayer structure in which the multiple build-up insulating layers 15 and the multiple build-up conductor layers 16 are alternately laminated on the first surface (11F) and the second surface (11B) of the core substrate 11.

The build-up insulating layers 15 are each formed of an insulating material. The build-up insulating layers 15 each have a thickness of, for example, 15 μm or more and 35 μm or less.

The build-up conductor layers 16 are each formed of a metal (for example, copper). The build-up conductor layers 16 each have a thickness of, for example, 10 μm or more and 20 μm or less.

Via conductors 17 are formed in the build-up insulating layers 15 closest to the core substrate 11 among the multiple build-up insulating layers 15. The via conductors 17 penetrate these build-up insulating layers 15 in the thickness direction. Among the multiple build-up conductor layers 16, the build-up conductor layers 16 closest to the core substrate 11 are connected to the core conductors 12 by the via conductors 17.

A build-up insulating layer 15 positioned uppermost among the build-up insulating layers 15 laminated on the first surface (11F) of the core substrate 11 is a first build-up insulating layer (15A).

A build-up conductor layer 16 positioned uppermost among the build-up conductor layers 16 laminated on the first surface (11F) side of the core substrate 11 is a first build-up conductor layer (16A). The first build-up conductor layer (16A) is formed on the first build-up insulating layer (15A). Further, the first build-up conductor layer (16A) includes an outer conductor circuit layer 35.

A second build-up conductor layer (16B) positioned second from the upper side among the build-up conductor layers 16 laminated on the first surface (11F) side of the core substrate 11 includes a conductor circuit layer (31B). The outer conductor circuit layer 35 is connected to the conductor circuit layer (31B) via the via conductors 17.

The first build-up conductor layer (16A) includes multiple first conductor pads 36 and multiple second conductor pads 37. And, for example, the multiple first conductor pads 36 and the multiple second conductor pads 37 are electrically connected by a circuit layer (not illustrated). Further, one or more of the multiple first conductor pads 36 and the multiple second conductor pads 37 are electrically connected to other conductor layers, such as the outer conductor circuit layer 35. The multiple first conductor pads 36, and the multiple second conductor pads 37 are included in the first build-up conductor layer (16A).

Figure 6:
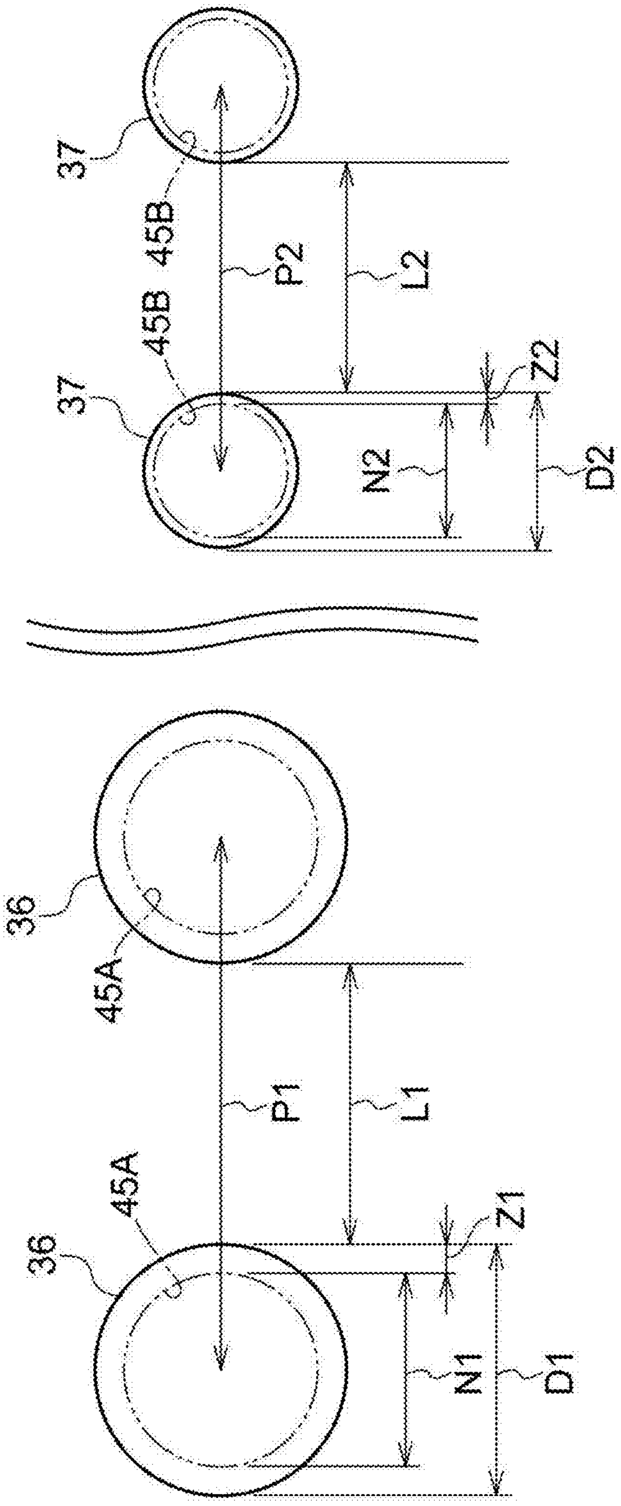
FIG. 6 is an explanatory diagram illustrating first conductor pads and second conductor pads of a wiring substrate according to an embodiment of the present invention.

In an embodiment of the present invention, as illustrated in FIG. 6, the first conductor pads 36 each have a circular shape in a plan view. The second conductor pads 37 each have a circular shape in a plan view and a smaller diameter than the first conductor pads 36.

On each of the first surface (11F) side and the second surface (11B) side of the core substrate 11, an outer build-up insulating layer 21 and an outer build-up conductor layer 22 (see FIG. 1) are laminated on the build-up insulating layer 15 positioned uppermost among the laminated build-up insulating layers 15. The outer build-up insulating layer 21 is an example of an "upper insulating layer" in an embodiment of the present invention. The outer build-up insulating layer 21 covers an upper surface of the first build-up insulating layer (15A), the first conductor pads 36 and the second conductor pads 37.

The second conductor pads 37 are formed at a center of the wiring substrate 100 in a width direction (arrow (W) direction) in a range of a cross section illustrated in FIG. 1. The first conductor pads 36 are formed on both sides of the second conductor pads 37 in the width direction.

First via holes (45A) and second via holes (45B) are formed in the outer build-up insulating layer 21. The first via holes (45A) are formed corresponding to the first conductor pads 36. The second via holes (45B) are formed corresponding to the second conductor pads 37.

As illustrated in FIG. 3, each of the first via holes (45A) is formed in a tapered shape that decreases in diameter toward a bottom part thereof. Further, each of the second via holes (45B) is also formed in a tapered shape that decreases in diameter toward a bottom part thereof. On an inner peripheral surface of the bottom part of each of the second via holes (45B), a curved diameter-reducing portion 48 is formed that is curved so as to decrease in diameter toward an end part on a bottom side. However, it is also possible to have a structure without the curved diameter-reducing portion 48.

First via conductors (25A) are formed by filling the first via holes (45A) with plating. The bottom parts of the first via conductors (25A) are in contact with the first conductor pads 36. Second via conductors (25B) are formed by filling the second via holes (45B) with plating. The bottom parts of the second via conductors (25B) are in contact with the second conductor pads 37.

In the following, regarding the first via holes (45A) and the second via holes (45B), an inner diameter of a bottom part is simply referred to as a "hole diameter." As illustrated in FIG. 6, a hole diameter (N2) of each of the second via holes (45B) is smaller than a hole diameter (N1) of each of the first via holes (45A). Specifically, the hole diameter (N1) of each of the first via holes (45A) is, for example, 20 μm or more and 40 μm or less, and the hole diameter (N2) of each of the second via holes (45B) is, for example, 10 μm or more and 20 μm or less. Further, a distance (pitch (P1)) between centers of adjacent first via holes (45A) is, for example, 80 μm or more and 100 μm or less, and a distance (pitch (P2)) between centers of adjacent second via holes (45B) is, for example, 30 μm or more and 60 μm or less.

Here, a "residue amount" related to the first conductor pads 36 and the second conductor pads 37 is defined. Specifically, the residue amount is a difference in radius between a pad in consideration and the bottom part of a via conductor in contact with this pad. For example, the residue amount (Z1) of each of the first conductor pads 36 is $Z1=(D1-N1)/2$ when the diameter of each of the first conductor pads 36 is D1 and the hole diameter of each of the first via conductors (25A) is N1. The residue amount (Z2) of each of the second conductor pads 37 is $Z2=(D2-N2)/2$ when the diameter of each of the second conductor pads 37 is D2 and the hole diameter of each of the second via conductors (25B) is N2.

In the wiring substrate 100 according to an embodiment of the present invention, for the residue amount (Z1) of each of the first conductor pads 36 and the residue amount (Z2) of each of the second conductor pads 37, the relationship $Z1>Z2$ holds.

The wiring substrate 100 has the multiple first conductor pads 36 and the multiple second conductor pads 37.

Here, an inter-pad distance is defined for each of the multiple first conductor pads 36 and the multiple second conductor pads 37. The inter-pad distance is a distance between two pads of the same type in consideration. As illustrated in FIG. 6, in the present embodiment, the first conductor pads 36 and the second conductor pads 37 each have a circular shape in a plan view. Therefore, for example, an inter-pad distance (L1) of the first conductor pads 36 is a shortest distance between adjacent first conductor pads 36. An inter-pad distance (L2) of the second conductor pads 37 is a shortest distance between adjacent second conductor pads 37.

In the wiring substrate 100 according to an embodiment of the present invention, for the inter-pad distance (L1) of the first conductor pads 36 and the inter-pad distance (L2) of the second conductor pads 37, the relationship L1>L2 holds.

As illustrated in detail in FIG. 2, a first surface plating layer 41 is formed on first outer pads (23A) and second outer pads (23B). The first surface plating layer 41 on the first outer pads (23A) is filled in first openings (27A) and further protrudes above a first surface solder resist layer (29F).

Similar to the first surface plating layer 41 on the first outer pads (23A), the first surface plating layer 41 on the second outer pads (23B) is also filled in second openings (27B) and protrudes above the first surface solder resist layer (29F). These first surface plating layers 41 have substantially the same protrusion height from the first surface solder resist layer (29F).

As illustrated in FIG. 3, the first surface plating layer 41 is formed of electrolytic Cu/Ni/Sn metal layers. A protrusion height of the Cu layer (41L) from the first surface solder resist layer (29F) is 3 μm or more and 20 μm or less. The Ni layer (41M) has a thickness of 2 μm or more and 7 μm or less, and the Sn layer (41N) has a thickness of 5 μm or more and 45 μm or less. In the example illustrated in FIG. 3, the Sn layer (41N) has a curved shape with an upward convex upper surface.

On the first surface (10F) and the second surface (10B) of the main body substrate 10, the outer build-up insulating layer 21 is covered by a solder resist layer 29. Substantially, the solder resist layer 29 forms the first surface (100F) and the second surface (100B) of the wiring substrate 100.

As an example, the solder resist layer 29 has a thickness of 7 μm or more and 25 μm or less, the outer build-up insulating layer 21 has a thickness of 10 μm or more and 20 μm or less, and the outer build-up conductor layer 22 has a thickness of 10 μm or more and 20 μm or less. The thickness of the solder resist layer 29 is defined as a distance from an upper surface of the outer build-up insulating layer 21 to an upper surface of the solder resist layer 29. The thickness of the outer build-up insulating layer 21 is defined as a distance from the upper surface of the outer build-up insulating layer 21 to an upper surface of the build-up insulating layer 15 formed directly below the outer build-up insulating layer 21. The thickness of each build-up insulating layer 15 is defined as a distance from an upper surface of each build-up insulating layer 15 to an upper surface of the build-up insulating layer 15 formed directly below each build-up insulating layer 15.

As illustrated in FIG. 2, outer pads 23 are formed on the first surface (10F) of the main body substrate 10. The first surface (100F) of the wiring substrate 100 includes the first surface solder resist layer (29F). Multiple openings 27 are formed in the first surface solder resist layer (29F). The openings 27 expose portions of a first surface outer build-up conductor layer (22F) positioned on the first surface (100F) side among the outer build-up conductor layers 22 as the outer pads 23.

The multiple openings 27 include the first openings (27A) and the second openings (27B). The first openings (27A) expose portions of the first surface outer build-up conductor layer (22F) as the first outer pads (23A), and the second openings (27B) expose portions of the first surface outer build-up conductor layer (22F) as the second outer pads (23B).

Specifically, the outer pads 23 include the first outer pads (23A) and the second outer pads (23B). The first outer pads (23A) are connected to the first conductor pads 36 via the first via conductors (25A). The second outer pads (23B) are connected to the second conductor pads 37 via the second via conductors (25B).

As illustrated in FIG. 1, element mounting regions (R1, R2) are formed on the first surface (100F) of the wiring substrate 100. Semiconductor elements (90, 91) are respectively mounted in the element mounting regions (R1, R2). The multiple second conductor pads 37 are formed at a boundary portion between the element mounting regions (R1, R2) and at positions on an inner side of the wiring substrate 100.

The semiconductor elements (90, 91) are electrically connected via the second conductor pads 37, the second via conductors (25B), the second outer pads (23B) and the first surface plating layer 41.

As illustrated in FIG. 1, multiple third openings 28 are formed in a second surface solder resist layer (29B) on the second surface (100B) side of the wiring substrate 100. The third openings 28 expose portions of a second surface outer build-up conductor layer (22B) on the second surface (100B) side as third outer pads 24.

The third outer pads 24 are connected to a first build-up conductor layer (16A) (the build-up conductor layer 16 formed lowermost) on the second surface (10B) side of the main body substrate 10 via fourth via conductors 26.

Multiple fourth via holes 46 are formed in the outer build-up insulating layer 21. The fourth via conductors 26 are formed by filling the fourth via holes 46 with plating. The fourth via holes 46 each have a hole diameter of 20 μm or more and 40 μm or less. A distance (pitch) between adjacent fourth via holes 46 is 80 μm or more and 100 μm or less. The fourth via holes 46 are each formed in a tapered shape that becomes thinner toward an upper side.

A second surface plating layer 42 is formed on the third outer pads 24. The second surface plating layer 42 is formed at bottom parts of the third openings 28. And it is recessed relative to an outer surface of the second surface solder resist layer (29B). The second surface plating layer 42 is formed of electroless Ni/Pd/Au metal layers. A surface treatment of the second surface (100B) is not particularly limited, and may be, for example, a surface treatment in which electroless Ni/Au layers, an OSP film, or the like is formed.

Next, a method for manufacturing the wiring substrate 100 is described.

Figure 4A:
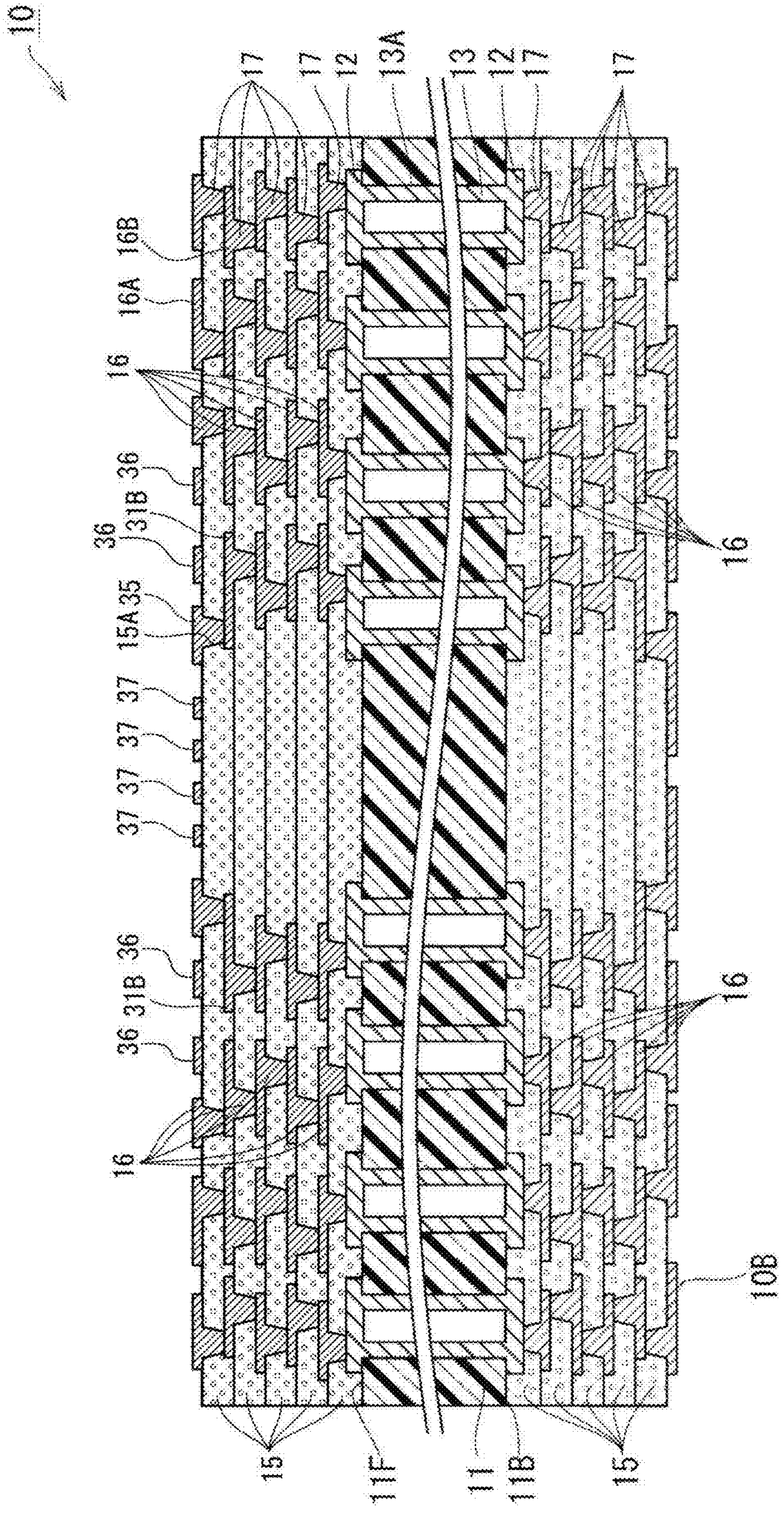
FIG. 4A is a cross-sectional view illustrating an example of a manufacturing process of a wiring substrate according to an embodiment of the present invention.
Figure 4B:
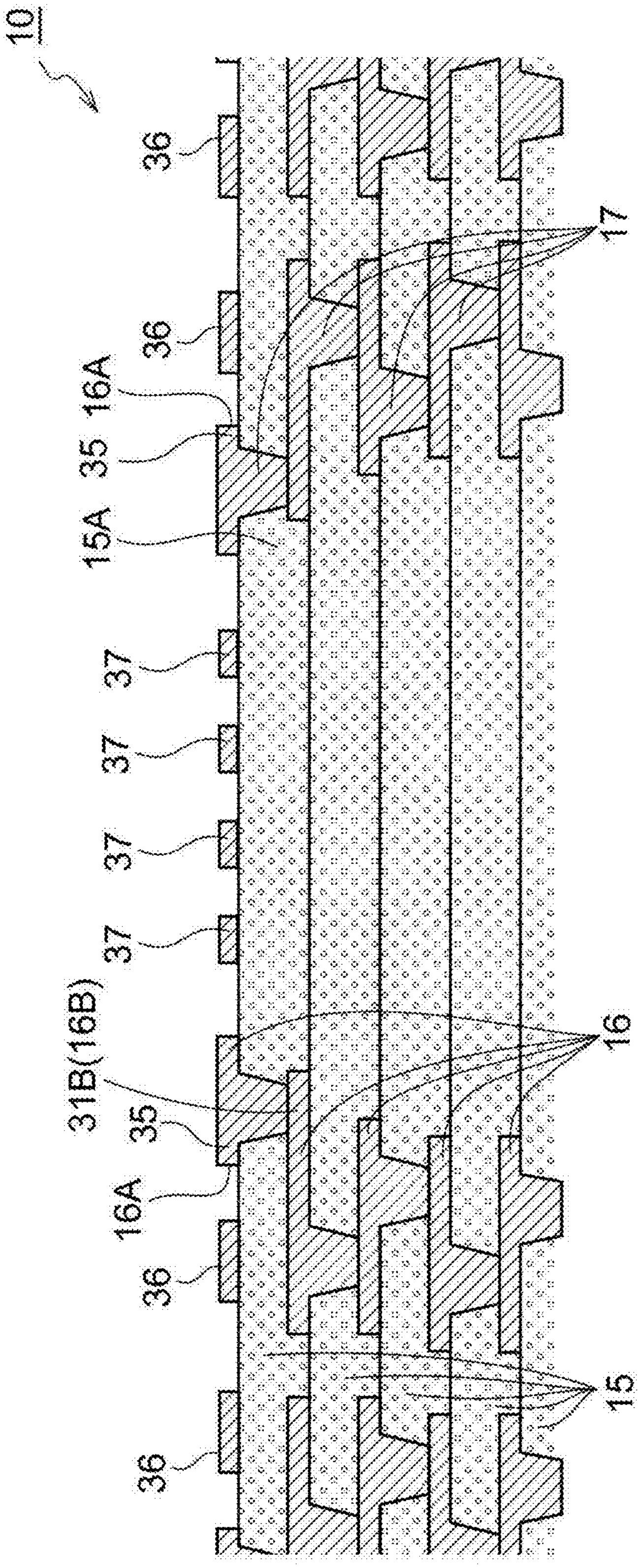
FIG. 4B is a partially enlarged cross-sectional view illustrating an example of a manufacturing process of a wiring substrate according to an embodiment of the present invention.

As illustrated in FIGS. 4A and 4B, in the method for manufacturing the wiring substrate 100 according to an embodiment of the present invention, the main body substrate 10 is prepared.

As illustrated in FIG. 4A, in the main body substrate 10, the core conductors 12 are formed on the first surface (11F) and the second surface (11B) of the core substrate 11. Further, the multiple build-up insulating layers 15 and the multiple build-up conductor layers 16 are alternately laminated on the first surface (11F) and the second surface (11B) of the core substrate 11.

With respect to this main body substrate 10, as also illustrated in FIG. 4B, the first conductor pads 36 and the second conductor pads 37 are formed at predetermined positions on the first build-up insulating layer (15A). The first conductor pads 36 and the second conductor pads 37 are formed, for example, using a semi-additive method or the like by electroless plating, plating resist processing, electrolytic plating, sputtering, or the like.

Figure 5A:
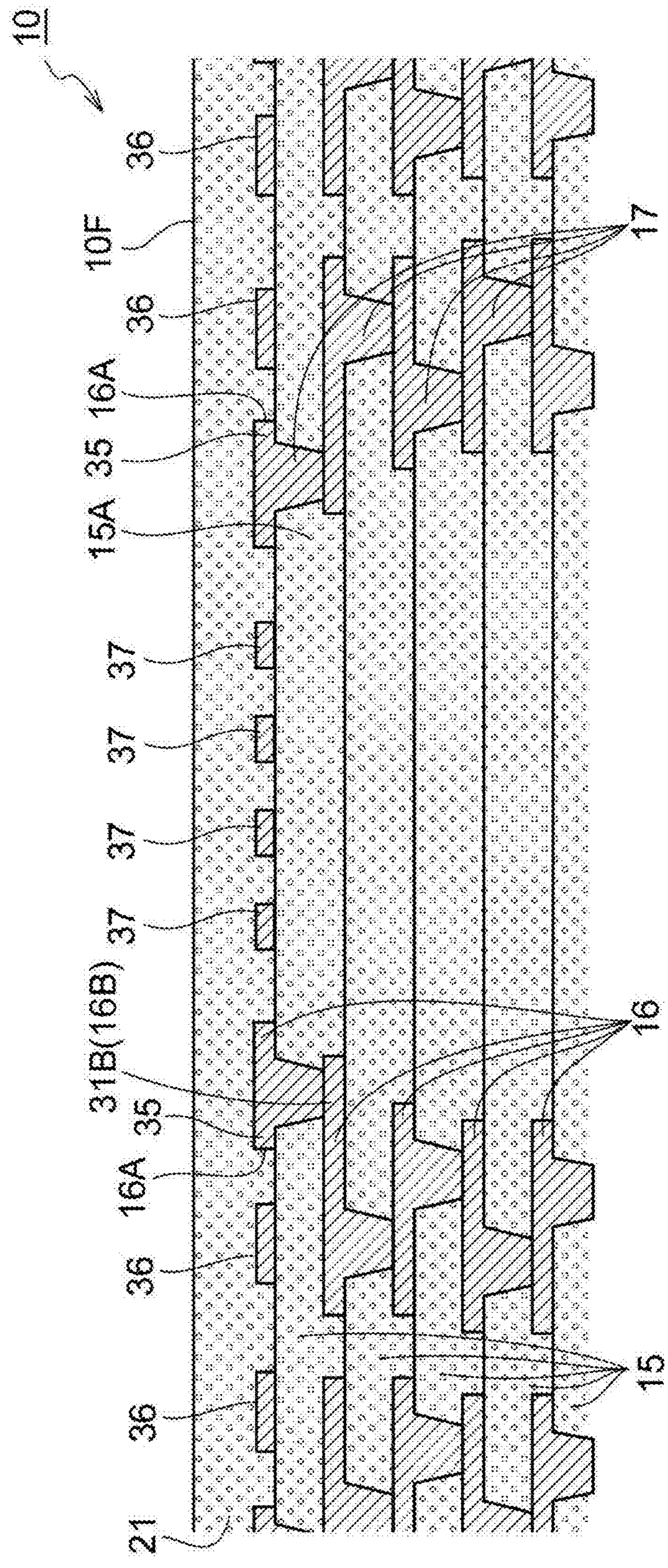
FIG. 5A is a partially enlarged cross-sectional view illustrating an example of a manufacturing process of a wiring substrate according to an embodiment of the present invention.

Next, as illustrated in FIG. 5A, the outer build-up insulating layer 21 is formed so as to cover the upper surface of the first build-up insulating layer (15A), the upper surfaces of the first conductor pads 36, and the upper surfaces of the second conductor pads 37. That is, the outer build-up insulating layer 21 is laminated on the upper surface of the first build-up insulating layer (15A), the upper surfaces of the first conductor pads 36, and the upper surfaces of the second conductor pads 37. The outer build-up insulating layer 21 is formed, for example, by laminating a film-like epoxy resin onto the first build-up insulating layer (15A) by lamination processing and by applying heat and pressure thereto.

Figure 5B:
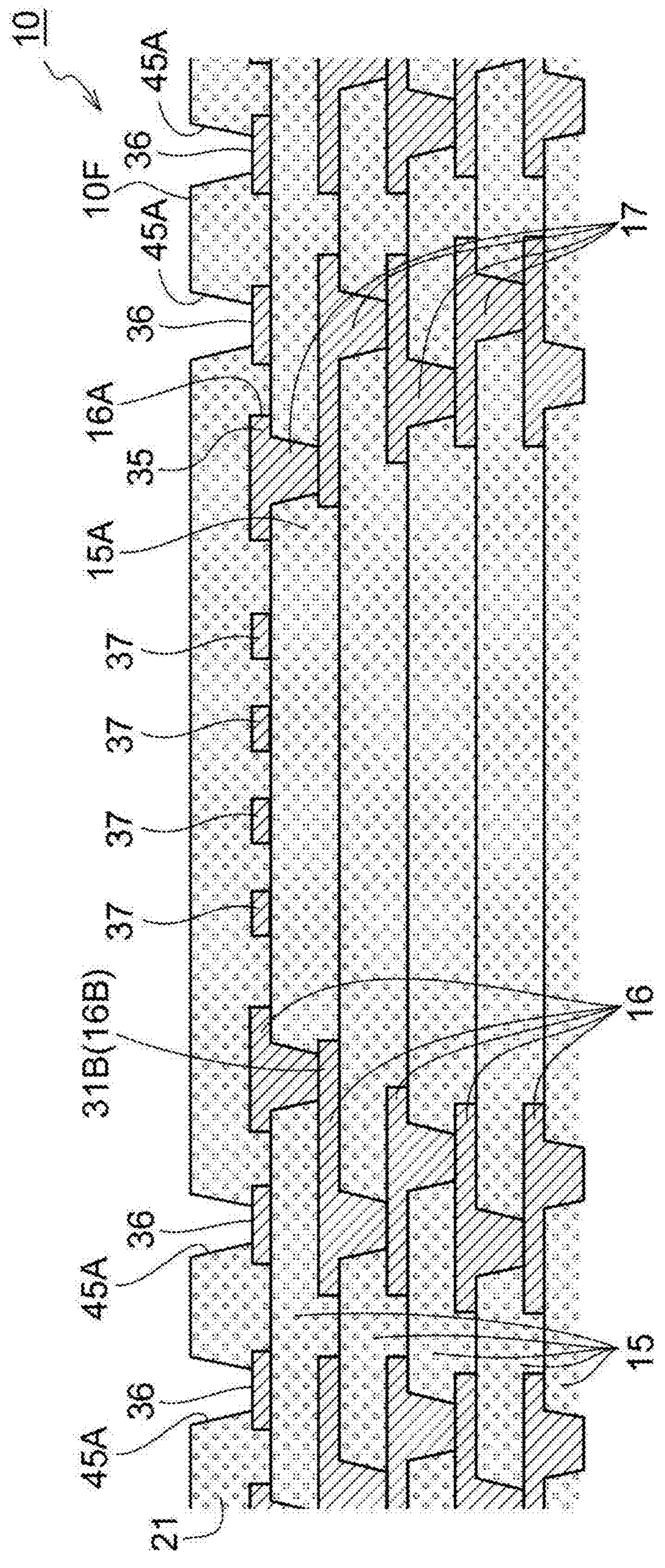
FIG. 5B is a partially enlarged cross-sectional view illustrating an example of a manufacturing process of a wiring substrate according to an embodiment of the present invention.

Next, as illustrated in FIG. 5B, the first via holes (45A) are formed in the outer build-up insulating layer 21. In an embodiment of the present invention, the first via holes (45A) are formed by irradiating laser to the outer build-up insulating layer 21 from above.

A wavelength of the laser used in forming the first via holes (45A) is, for example, 1 μm or more and 15 μm or less. In an embodiment of the present invention, CO 2 laser is used in the formation of the first via holes (45A). By forming the first via holes (45A) in the outer build-up insulating layer 21, the upper surfaces of the first conductor pads 36 are partially exposed.

Each of the first via holes (45A) has a shape that gradually decreases in inner diameter toward the bottom part thereof, and the bottom part is formed to have a predetermined hole diameter (N1) (see FIG. 6).

Figure 5C:
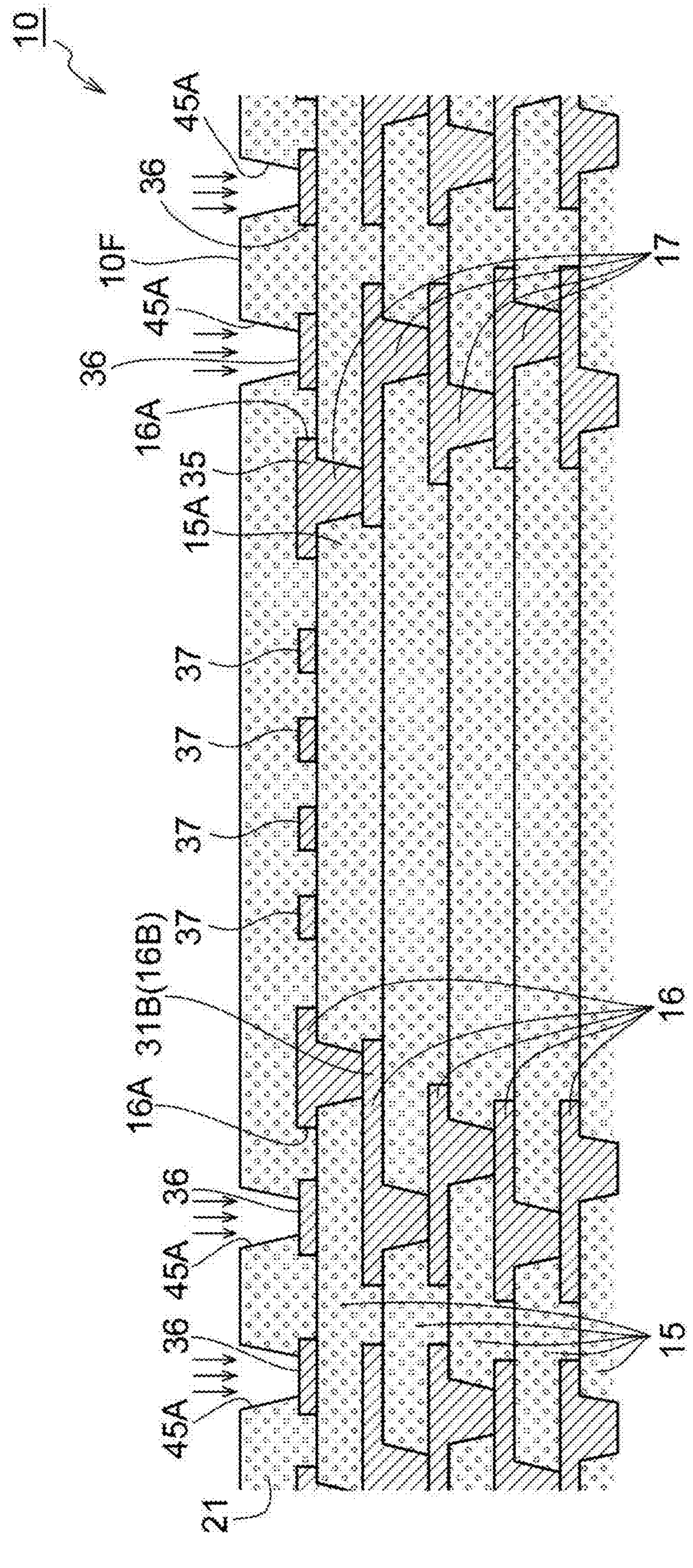
FIG. 5C is a partially enlarged cross-sectional view illustrating an example of a manufacturing process of a wiring substrate according to an embodiment of the present invention.

Next, as illustrated in FIG. 5C, the first via holes (45A) are subjected to a first desmear treatment for a certain processing time (T1). Resin residues generated due to the formation of the first via holes (45A) are completely or partially removed from the first via holes (45A) by the first desmear treatment. For the first desmear treatment, for example, a method such as a wet desmear treatment using an alkaline permanganate solution or a dry desmear treatment using a gas such as plasma may be used.

Further, when necessary, the first conductor pads 36 are subjected to a roughening treatment, and the upper surfaces of the first conductor pads 36 are roughened.

Figure 5D:
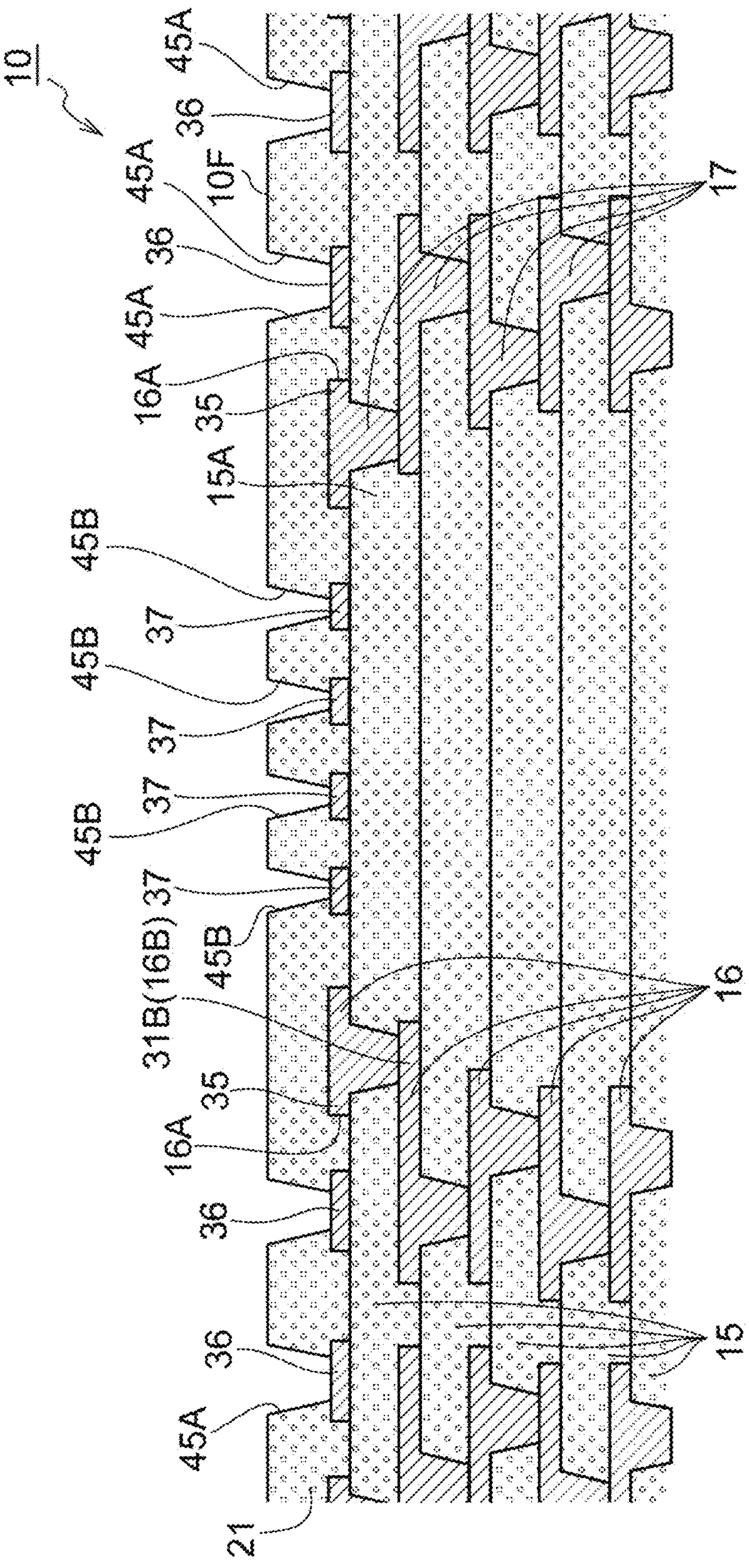
FIG. 5D is a partially enlarged cross-sectional view illustrating an example of a manufacturing process of a wiring substrate according to an embodiment of the present invention.

Next, as illustrated in FIG. 5D, the second via holes (45B) are formed in the outer build-up insulating layer 21. In an embodiment of the present invention, the second via holes (45B) are formed by irradiating laser to the outer build-up insulating layer 21 from above.

A wavelength of the laser used in forming the second via holes (45B) is shorter than the wavelength of the laser used in forming the first via holes (45A). For example, the wavelength of the laser used in forming the second via holes (45B) is 100 nm or more and 500 nm or less. In an embodiment of the present invention, solid laser such as YAG laser is used as ultraviolet laser in the formation of the second via holes (45B). When YAG laser is used, for example, laser with a wavelength of 355 nm may be irradiated. By forming the second via holes (45B) in the outer build-up insulating layer 21, the upper surfaces of the second conductor pads 37 are partially exposed.

Each of the second via holes (45B) has a shape that gradually decreases in inner diameter toward the bottom part thereof, and the bottom part is formed to have a predetermined hole diameter (N2) (see FIG. 6). This hole diameter (N2) is smaller than the hole diameter (N1) of the bottom part of each of the first via holes (45A).

In an embodiment of the present invention, the wavelength of the laser used in the formation of the second via holes (45B) is shorter than the wavelength of the laser used in the formation of the first via holes (45A). Therefore, compared to a case where the wavelength of the laser used in the formation of the second via holes (45B) is longer than the wavelength of the laser used in the formation of the first via holes (45A), the second via holes (45B) with a smaller diameter than the first via holes (45A) can be easily formed.

Figure 5E:
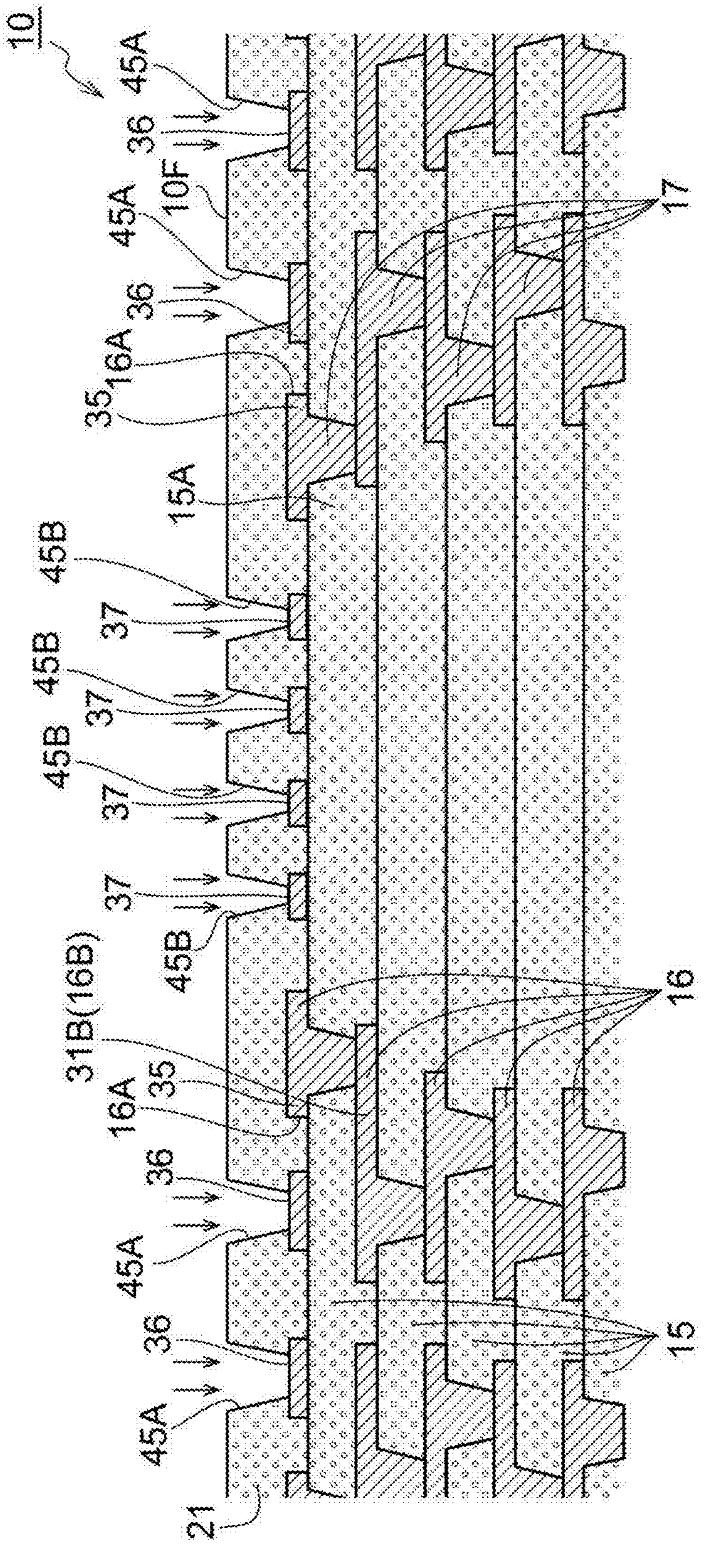
FIG. 5E is a partially enlarged cross-sectional view illustrating an example of a manufacturing process of a wiring substrate according to an embodiment of the present invention.

Next, as illustrated in FIG. 5E, the second via holes (45B) are subjected to a second desmear treatment for a certain processing time (T2). Resin residues generated due to the formation of the second via holes (45B) are completely or partially removed from the second via holes (45B) by the second desmear treatment. The second desmear treatment uses the same method as the first desmear treatment. In the present embodiment, the processing time (T2) of the second desmear treatment is set shorter than the processing time (T1) of the first desmear treatment.

Further, when necessary, the second conductor pads 37 are subjected to a roughening treatment, and the upper surfaces of the second conductor pads 37 are roughened.

In this way, when the second via holes (45B) are subjected to the second desmear treatment, substantially, the first via holes (45A) are also subjected to a desmear treatment.

In an embodiment of the present invention, after performing the first desmear treatment, the second via holes (45B) are formed. That is, when the first desmear treatment is performed, the second via holes (45B) are not formed. Therefore, in the first desmear treatment, the second via holes (45B) are not subjected to a desmear treatment.

Then, a total processing time (T3) of the desmear treatments with respect to the first via holes (45A) is T3=T1+T2. When removing resin residues from the first via holes (45A), the total processing time (T3) is set to be a processing time sufficient for removing the resin residues. On the other hand, the desmear treatment for the second via holes (45B) takes the processing time (T2). Therefore, for example, first, the total processing time (T3) of the desmear treatments for the first via holes (45A) and the processing time (T2) of the desmear treatment for the second via holes (45B) are determined. Then, from these processing times, the processing time (T1) of the desmear treatment for the first via holes (45A) can be determined as T1=T3−T2.

Although not illustrated, similarly to that on the first surface (10F), an outer build-up insulating layer 21 is also formed on the second surface (10B) of the main body substrate 10. Then, laser is irradiated to the outer build-up insulating layer 21 on the second surface (10B), and the fourth via holes 46 are formed.

Figure 5F:
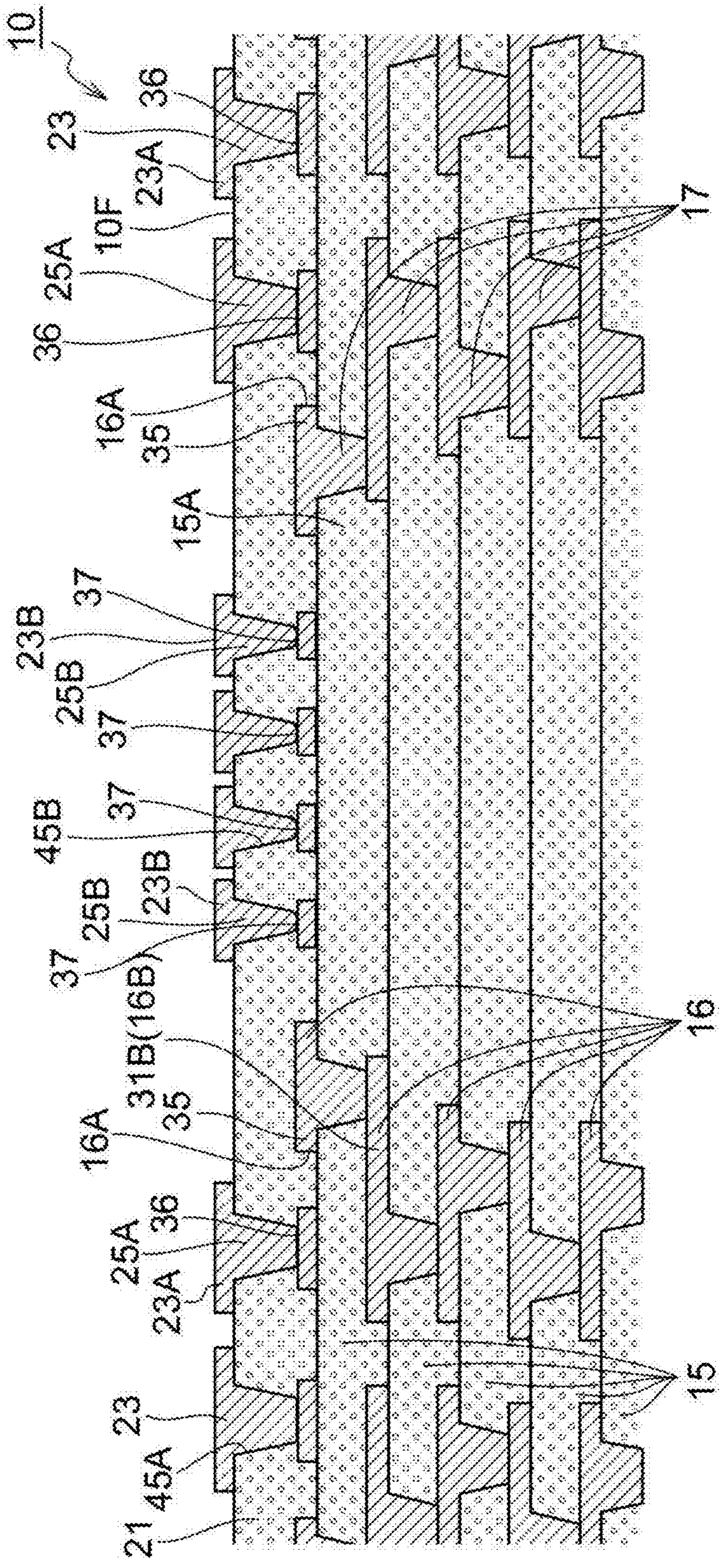
FIG. 5F is a partially enlarged cross-sectional view illustrating an example of a manufacturing process of a wiring substrate according to an embodiment of the present invention.

Next, as illustrated in FIG. 5F, on the first surface (10F) of the main body substrate 10, the first via conductors (25A) are formed in the first via holes (45A), and the second via conductors (25B) are formed in the second via holes (45B). In an embodiment of the present invention, the first via conductors (25A) and the second via conductors (25B) are formed at the same time. The meaning of "at the same time" includes that the formation of the first via conductors (25A) and the formation of the second via conductors (25B) start at the same time, and that the formation of the first via conductors (25A) and the formation of the second via conductors (25B) end at the same time. Further, it is also possible that the start of the formation of the first via conductors (25A) and the start of the formation of the second via conductors (25B) are temporally shifted or that the end of the formation of the first via conductors (25A) and the end of the formation of the second via conductors (25B) are temporally shifted. That is, it includes a case where the time for forming the first via conductors (25A) and the time for forming the second via conductors (25B) partially overlap. Further, it also includes a case where, even when the time for forming the first via conductors (25A) and the time for forming the second via conductors (25B) do not partially overlap, the formation of the first via conductors (25A) and the formation of the second via conductors (25B) are continuous and can be regarded as substantially simultaneous.

In the following, although not illustrated, on the second surface (10B) of the main body substrate 10, the fourth via conductors 26 are formed in the fourth via holes 46. The first via conductors (25A), the second via conductors (25B) and the fourth via conductors 26 are formed by, for example, electroless plating, plating resist processing, electrolytic plating, or the like.

Further, the outer build-up conductor layers 22 (the first surface outer build-up conductor layer (22F) and the second surface outer build-up conductor layer (22B)) are respectively formed on the outer build-up insulating layers 21.

Further, the first surface solder resist layer (29F) is formed on the first surface (10F) side of the main body substrate 10, and the second surface solder resist layer (29B) is formed on the second surface (10B).

Then, for example, by lithography processing, the first openings (27A) are formed in the first surface solder resist layer (29F), and the third openings 28 are formed in the second surface solder resist layer (29B). The first openings (27A) expose portions of the first surface outer build-up conductor layer (22F) as the first outer pads (23A). The third openings 28 expose portions of the second surface outer build-up conductor layer (22B) as the third outer pads 24.

Further, by ultraviolet laser irradiation, the second openings (27B) are formed in the first surface solder resist layer (29F). The second openings (27B) expose portions of the first surface outer build-up conductor layer (22F) as the second outer pads (23B).

When necessary, the first outer pads (23A), the second outer pads (23B) and the third outer pads 24 are subjected to a desmear treatment.

Next, the first surface solder resist layer (29F) is covered by a resin protective film (not illustrated). Then, electroless plating is performed on the second surface (10B) side of the main body substrate 10, and the second surface plating layer 42 is formed on the third outer pads 24.

Further, the resin protective film covering the first surface solder resist layer (29F) is removed. Further, similarly, the second surface solder resist layer (29B) is covered by a resin protective film (not illustrated).

Then, electrolytic plating is performed on the first surface (10F) side of the main body substrate 10, and the first surface plating layer 41 is formed on the first outer pads (23A) and the second outer pads (23B).

Then, the resin protective film covering the second surface solder resist layer (29B) is removed, and the wiring substrate 100 is completed.

Next, effects of the present embodiment are described.

In the wiring substrate 100 according to an embodiment of the present invention, the first via holes (45A) and the second via holes (45B) are formed in the outer build-up insulating layer 21. Then, by subjecting the first via holes (45A) and the second via holes (45B) to a desmear treatment, resin residues are completely or partially removed from the first via holes (45A) and the second via holes (45B).

Here, for comparison, it is assumed where the first via holes (45A) and the second via holes (45B) are subjected to a desmear treatment for the same processing time. For example, it is assumed where the first via holes (45A) and the second via holes (45B) are subjected to a desmear treatment at the same time.

In this case, since the hole diameter (N1) of each of the first via holes (45A) is larger than the hole diameter (N2) of each of the second via holes (45B), when both the first via holes (45A) and the second via holes (45B) are subjected to a desmear treatment for the same processing time, the processing time is set to the processing time for the first via holes (45A). That is, the second via holes (45B) each having a relatively small hole diameter are subjected to a desmear treatment for a longer time than necessary.

When the second via holes (45B) are subjected to a desmear treatment for a longer time than necessary, haloing is likely to occur between the second conductor pads 37 and the outer build-up insulating layer 21 on an upper side of the second conductor pads 37. That is, the outer build-up insulating layer 21 is likely to peel off from the second conductor pads 37. In particular, in an embodiment of the present invention, the outer build-up insulating layer 21 contains resin. When the resin melts due to the desmear treatment for the second via holes (45B), it is likely to cause the outer build-up insulating layer 21 to peel off from the second conductor pads 37.

Then, there is a risk that a peeled portion may spread between the outer build-up insulating layer 21 and the first build-up insulating layer (15A). In particular, as in an embodiment of the present invention, when the inter-pad distance (L2) of the second conductor pads 37 is relatively short compared to the inter-pad distance (L1) of the first conductor pads 36, the outer build-up insulating layer 21 is likely to peel off from the first build-up insulating layer (15A) in a portion between the multiple second conductor pads 37.

Therefore, in an embodiment of the present invention, the processing time (T2) of the desmear treatment for the second via holes (45B) is shorter than the total processing time (T3) of the desmear treatments for the first via holes (45A). Therefore, compared to the case where the first via holes (45A) and the second via holes (45B) are subjected to a desmear treatment for the same processing time, haloing between the second conductor pads 37 and the outer build-up insulating layer 21 above the second conductor pads 37 can be suppressed.

In particular, in the wiring substrate 100 according to an embodiment of the present invention, as illustrated in FIG. 6, for the residue amount (Z1) of each of the first conductor pads 36 and the residue amount (Z2) of each of the second conductor pads 37, the relationship Z1>Z2 holds. In this way, when the residue amount (Z2) is relatively short, compared to a case where the relationship Z1≤Z2 holds between the residual amounts (Z1, Z2), peeling due to haloing between the second conductor pads 37 and the outer build-up insulating layer 21 is likely to occur. However, in an embodiment of the present invention, the processing time (T2) of the desmear treatment for the second via holes (45B) is shorter than the total processing time (T3) of the desmear treatments for the first via holes (45A). Therefore, occurrence of peeling between the second conductor pads 37 and the outer build-up insulating layer 21 due to haloing can be suppressed.

Further, in the wiring substrate 100 according to an embodiment of the present invention, for the inter-pad distance (L1) of the first conductor pads 36 and the inter-pad distance (L2) of the second conductor pads 37, the relationship L1>L2 holds. In this way, when the inter-pad distance (L2) is relatively short, compared to a case where the relationship L1≤L2 holds between the inter-pad distances (L1, L2), peeling of the outer build-up insulating layer 21 from the first build-up insulating layer (15A) is likely to occur. However, in an embodiment of the present invention, since the processing time (T2) of the desmear treatment for the second via holes (45B) is shorter than the processing time (T3) of the desmear treatments for the first via holes (45A), occurrence of haloing between the first build-up insulating layer (15A) and the outer build-up insulating layer 21 can be suppressed.

In the above, the processing time (T2) of the desmear treatment for the second via holes (45B) is set shorter than the processing time (T1) of the desmear treatment for the first via holes (45A). That is, T1>T2. However, since the total processing time (T3) of the desmear treatments for the first via holes (45A) is T3=T1+T2, for example, even when T1≤T2, a state in which T3>T2 can be realized. As in an embodiment of the present invention, by setting T1>T2, a state in which T3 is sufficiently longer than T2 can be realized.

In any case, the processing time (T1) of the first desmear treatment and the processing time (T2) of the second desmear treatment can be set, for example, as predetermined processing times.

In the above, the laser used in the formation of the second via holes (45B) is ultraviolet light. However, it may be visible light as long as it has a shorter wavelength than that of the laser used in the formation of the first via holes (45A).

Figure 7:
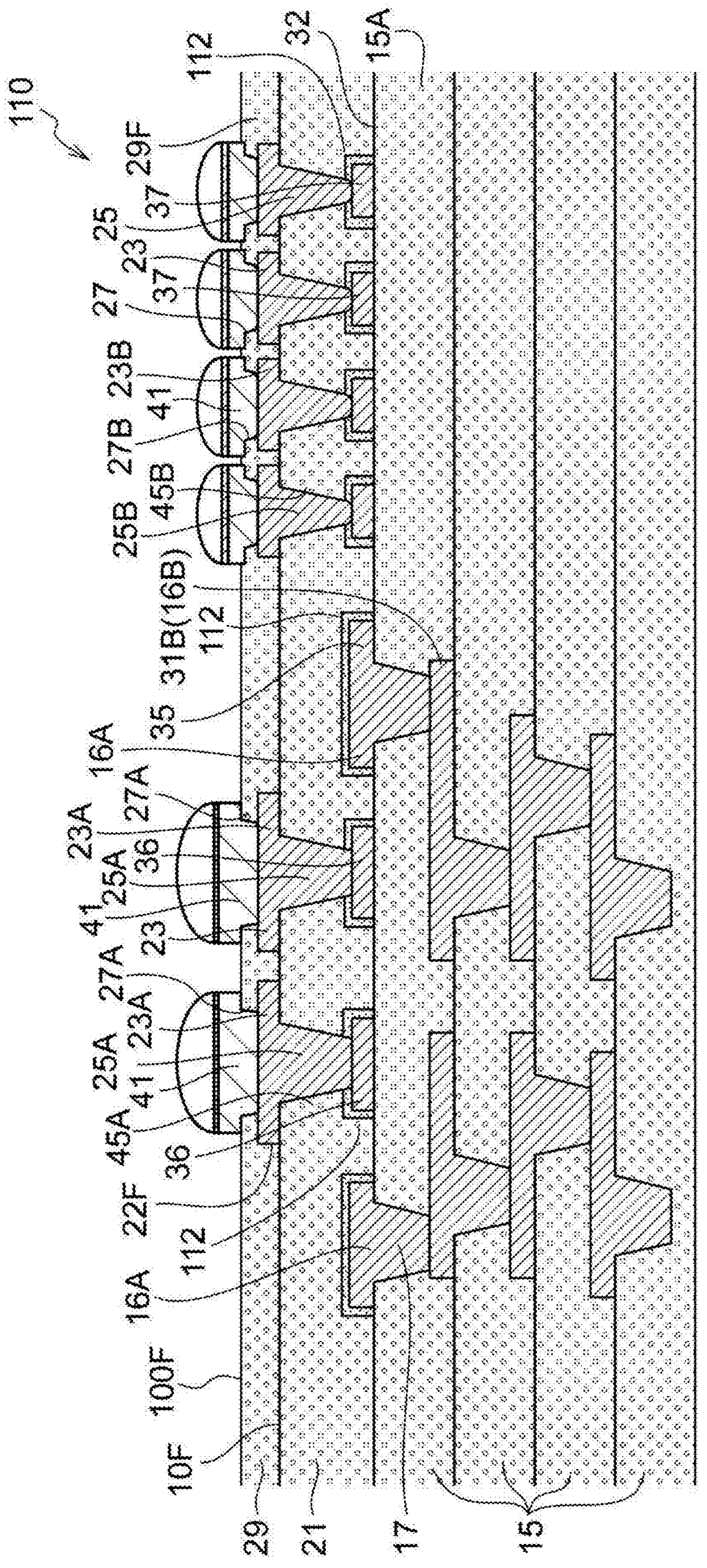
FIG. 7 is a partially enlarged cross-sectional view illustrating a modified example of a wiring substrate according to an embodiment of the present invention.

In the first embodiment, it is also possible to have a structure of a wiring substrate 110 of a modified example illustrated in FIG. 7.

In the wiring substrate 110 of the modified example, a coating film 112 is formed on the surfaces of the outer conductor circuit layer 35, the first conductor pads 36 and the second conductor pads 37. Specifically, the coating film 112 covers the surfaces of the outer conductor circuit layer 35, the first conductor pads 36 and the second conductor pads 37 that face the outer build-up insulating layer 21. The coating film 112 may be formed only on portions of the surfaces of the outer conductor circuit layer 35, the first conductor pads 36 and the second conductor pads 37 that face the outer build-up insulating layer 21.

The coating film 112 increases the adhesion between the first conductor pads 36 and second conductor pads 37 and the outer build-up insulating layer 21. The coating film 112 is formed of, for example, a material that can bind to both an organic material such as a resin that forms the outer build-up insulating layer 21 and an inorganic material such as a metal that forms the first conductor pads 36 and second conductor pads 37. The coating film 112 is formed of, for example, a material that contains both a reactive group capable of chemically bonding to an organic material and a reactive group capable of chemically bonding to an inorganic material. An example of a material of the coating film 112 is a silane coupling agent containing an azole silane compound such as a triazole compound. The material of the coating film 112 is not limited to a silane coupling agent as long as the material can increase the adhesion strength between the first conductor pads 36 and second conductor pads 37 and the outer build-up insulating layer 21 compared to a case where the outer build-up insulating layer 21 is directly formed on the first conductor pads 36 and second conductor pads 37. Compared to the case where the outer build-up insulating layer 21 is directly formed on the first conductor pads 36 and second conductor pads 37, the first conductor pads 36 and second conductor pads 37 adhere to the outer build-up insulating layer 21 with high strength due to the coating film 112.

In a method for manufacturing the wiring substrate 110 of the modified example, for example, the coating film 112 is formed after the first conductor pads 36 and second conductor pads 37 are formed on the first build-up insulating layer (15A) (see FIGS. 4A and 4B) and before the outer build-up insulating layer 21 is formed (see FIG. 5A). Then, when the first via holes (45A) are formed in the outer build-up insulating layer 21, portions of the coating film 112 corresponding to the first via holes (45A) are removed. Similarly, when the second via holes (45B) are formed in the outer build-up insulating layer 21, portions of the coating film 112 corresponding to the second via holes (45B) are removed.

In the above, in the methods for manufacturing the wiring substrates of the first embodiment and the modified example, an example is described where the second via holes (45B) are formed after the first desmear treatment is performed. However, it is also possible that, after the first via holes (45A) and the second via holes (45B) are formed in the outer build-up conductor layer 21, the first desmear treatment and the second desmear treatment are performed in this order. In this case, for example, when the first desmear treatment is performed, the second via holes (45B) are prevented from being affected by the first desmear treatment. Specifically, when the first desmear treatment is performed, for example, the second via holes (45B) are masked. Or it is also possible that, when the desmear treatment is performed using a desmear treatment liquid, the second via holes (45B) are prevented from being immersed in the desmear treatment liquid. Further, when the second desmear treatment is performed, the first via holes (45A) are prevented from being affected by the second desmear treatment. Specifically, when the second desmear treatment is performed, for example, the first via holes (45A) are masked. Or it is also possible that, when the desmear treatment is performed using a desmear treatment liquid, the first via holes (45A) are prevented from being immersed in the desmear treatment liquid. As a result, between the processing time (T1) of the first desmear treatment applied to the first via holes (45A) and the processing time (T2) of the second desmear treatment applied to the second via holes (45B), the relationship T1>T2 can be satisfied.

Next, a second embodiment is described. A wiring substrate manufactured using a method for manufacturing a wiring substrate of the second embodiment also includes multiple first conductor pads and multiple second conductor pads as conductor pads provided in the wiring substrate. Then, the multiple first conductor pads have a relatively long inter-pad distance between the first conductor pads, whereas the multiple second conductor pads have a relatively short inter-pad distance between the second conductor pads. In the following, the wiring substrate of the second embodiment will be simply referred to as a wiring substrate 200. In the second embodiment, elements, members, and the like that are the same as those in the first embodiment are denoted using the same reference numeral symbols, and a detailed description thereof is omitted.

Figure 8:
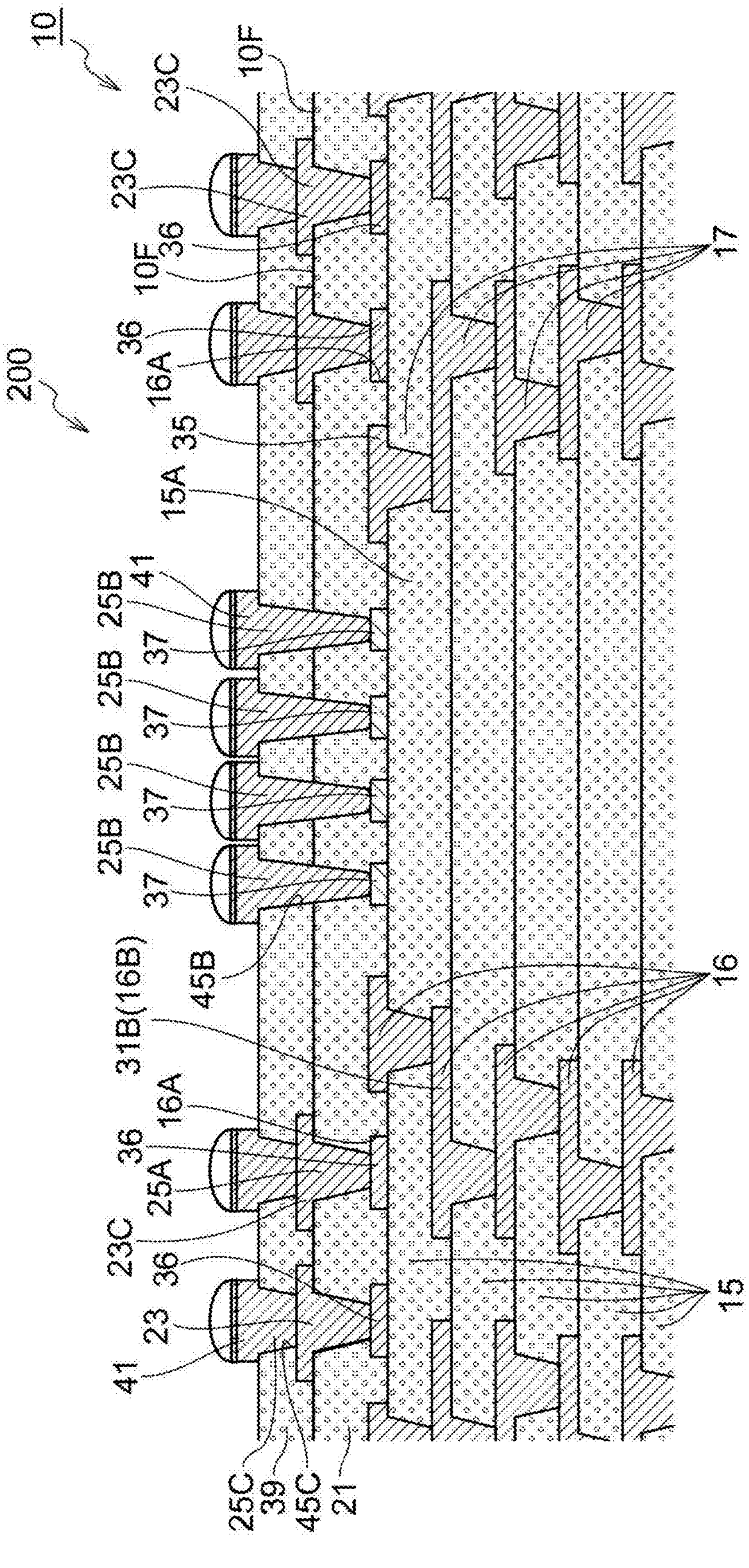
FIG. 8 is a partially enlarged cross-sectional view illustrating a wiring substrate according to a second embodiment of the present invention.

As illustrated in FIG. 8, in the wiring substrate 200 of the second embodiment, a second upper insulating layer 39 is laminated on the upper surface of the outer build-up insulating layer 21. Further, in the wiring substrate 200 of the second embodiment, third outer pads (23C) are formed on the outer build-up insulating layer 21. The third outer pads (23C) are formed, for example, similar in arrangement and shape to the first outer pads (23A) in the wiring substrate 100 of the first embodiment. In the second embodiment, the third outer pads (23C) are an example of third conductor pads. Then, the second upper insulating layer 39 covers the upper surface of the outer build-up insulating layer 21, which is an example of an upper insulating layer, and covers the third outer pads (23C). In the second embodiment, the second upper insulating layer 39 may be a solder resist layer.

Further, multiple third via holes (45C) penetrating the second upper insulating layer 39 are formed in the second upper insulating layer 39. Third via conductors (25C) are formed in the third via holes (45C).

In the second embodiment, the second via holes (45B) penetrate both the outer build-up insulating layer 21 and the second upper insulating layer 39. Then, the second via conductors (25B) are formed in the second via holes (45B).

The first surface plating layer 41 is formed on the second via conductors (25B) and on the third via conductors (25C).

In an embodiment of the present invention, as in the wiring substrate 200 of the second embodiment, a structure can also be adopted in which the second upper insulating layer 39 is provided and the second via holes (45B) are formed penetrating multiple insulating layers (the outer build-up insulating layer 21 and the second upper insulating layer 39).

Next, a method for manufacturing the wiring substrate 200 of the second embodiment is described.

In the method for manufacturing the wiring substrate 200 of the second embodiment, similar to the method for manufacturing the wiring substrate 100 of the first embodiment, with respect to the main body substrate 10, the first conductor pads 36 and the second conductor pads 37 are formed at predetermined positions on the first build-up insulating layer (15A) (see FIGS. 4A and 4B). Then, the outer build-up insulating layer 21 is formed so as to cover the upper surface of the first build-up insulating layer (15A), the upper surfaces of the first conductor pads 36, and the upper surfaces of the second conductor pads 37 (see FIG. 5A). Further, the first via holes (45A) are formed in the outer build-up insulating layer 21, for example, by irradiating laser from above (see FIG. 5B).

Then, the first via holes (45A) are subjected to a first desmear treatment for a certain processing time (T1) (see FIG. 5C). Further, when necessary, the first conductor pads 36 are subjected to a roughening treatment.

Figure 9A:
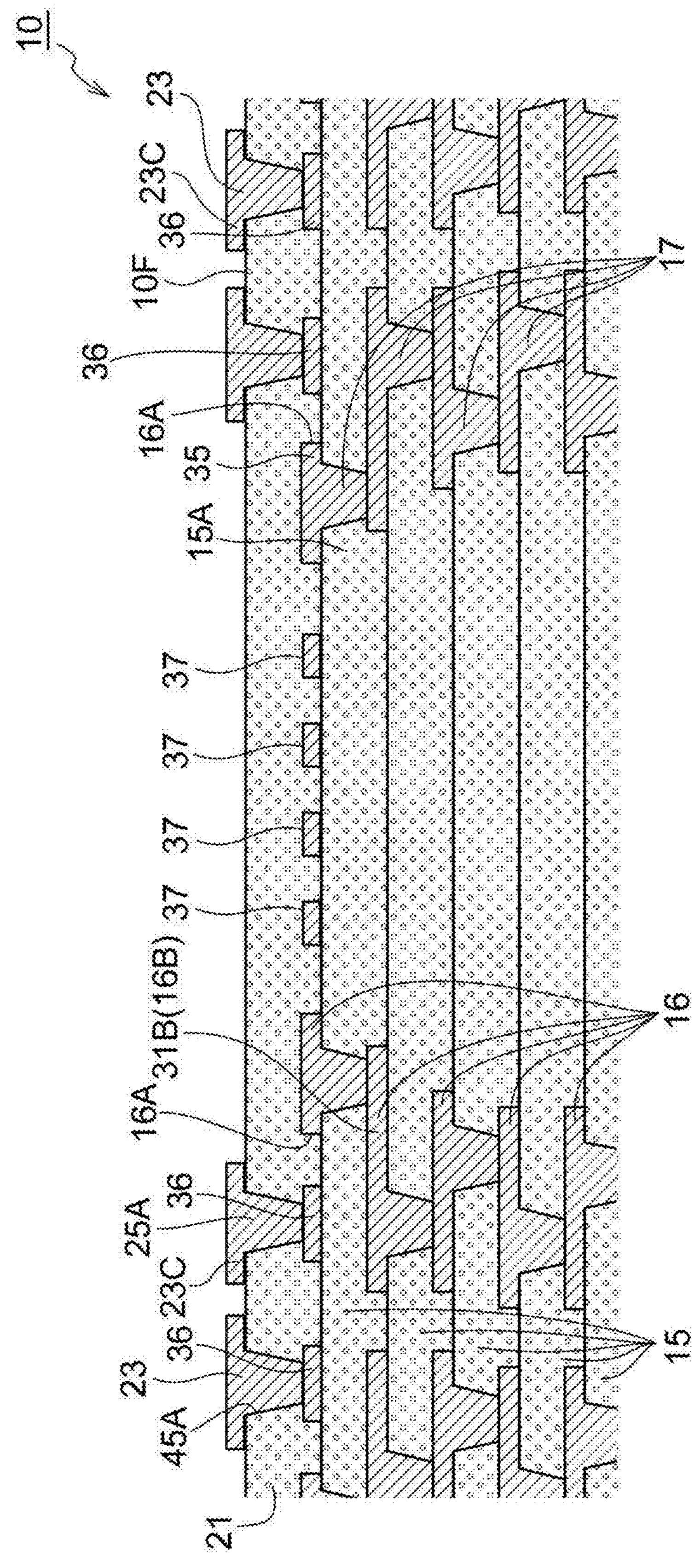
FIG. 9A is a partially enlarged cross-sectional view illustrating an example of a manufacturing process of a wiring substrate according to an embodiment of the present invention.

After that, in the method for manufacturing the wiring substrate 200 of the second embodiment, as illustrated in FIG. 9A, on the first surface (10F) of the main body substrate 10, the first via conductors (25A) are formed in the first via holes (45A).

Figure 9B:
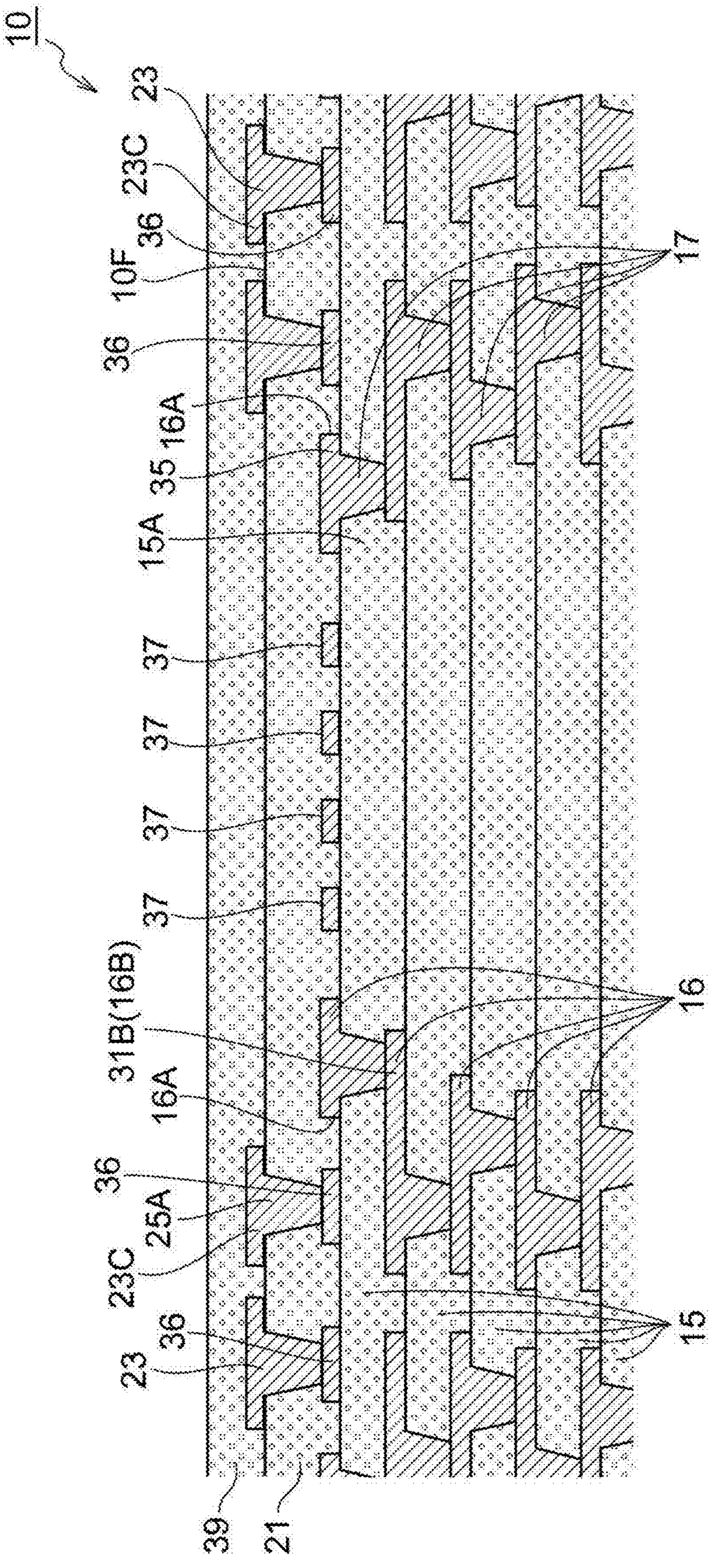
FIG. 9B is a partially enlarged cross-sectional view illustrating an example of a manufacturing process of a wiring substrate according to an embodiment of the present invention.

Then, as illustrated in FIG. 9B, on the upper surface of the outer build-up insulating layer 21, the second upper insulating layer 39 is formed. The second upper insulating layer 39 is formed, for example, by laminating a film-like epoxy resin onto the outer build-up insulating layer 21 by lamination processing and by applying heat and pressure thereto. The second upper insulating layer 39 is covered by a resin protective film.

Here, similarly to the first embodiment illustrated in FIG. 1, the outer build-up insulating layer 21 is formed on the second surface (10B) of the main body substrate 10. Laser is irradiated to the outer build-up insulating layer 21 on the second surface (10B), and the fourth via holes 46 are formed. The fourth via conductors 26 are formed in the fourth via holes 46, and the outer build-up conductor layer 22 is formed on the outer build-up insulating layer 21 of the second surface (10B). Further, the second surface solder resist layer (29B) of the second surface (10B) is formed.

The third openings 28 are formed in the second surface solder resist layer (29B). Then, the second surface plating layer 42 is formed on the third outer pads 24 on the second surface (10B) side of the main body substrate 10. The second surface solder resist layer (29B) is covered by a resin protective film. Then, the resin protective film covering the second upper insulating layer 39 is removed.

Figure 9C:
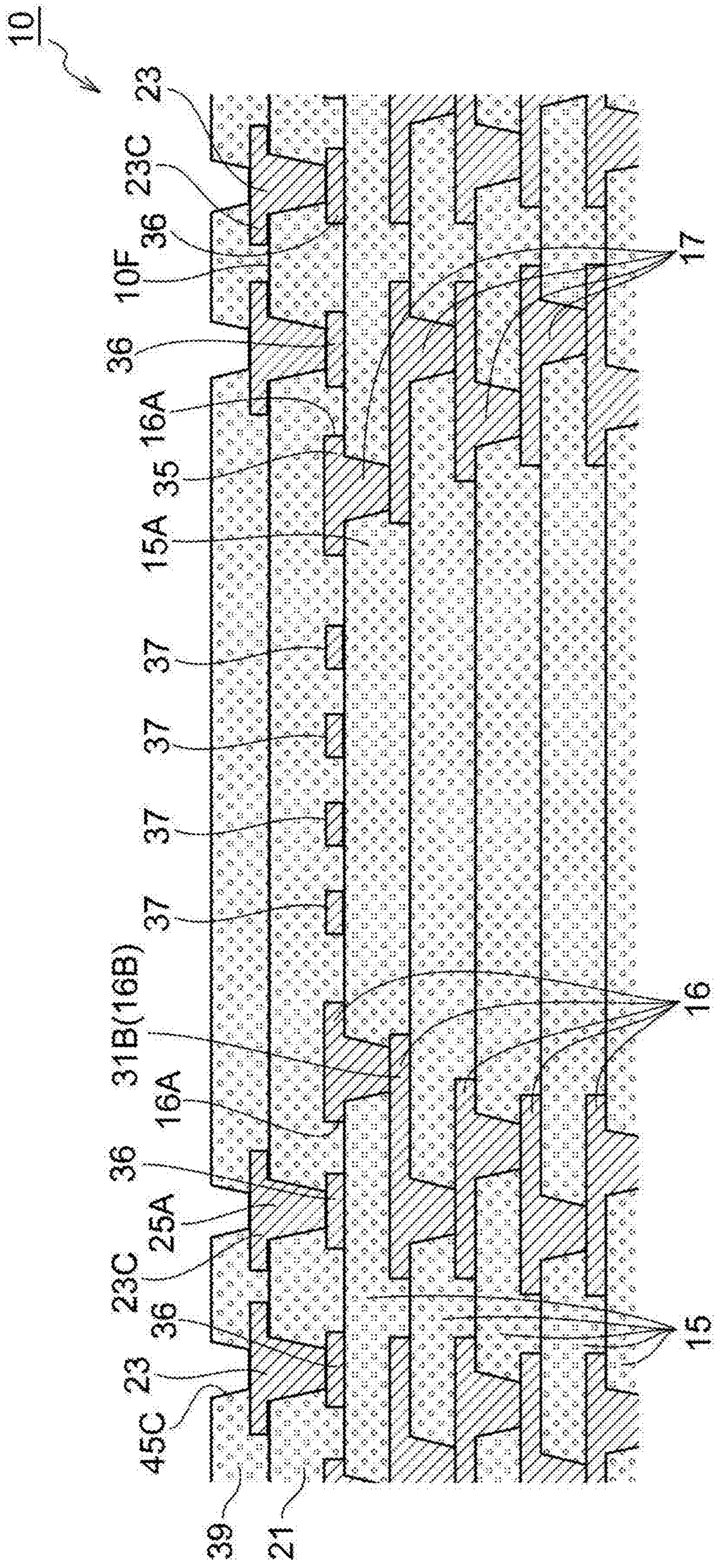
FIG. 9C is a partially enlarged cross-sectional view illustrating an example of a manufacturing process of a wiring substrate according to an embodiment of the present invention.

Next, as illustrated in FIG. 9C, the third via holes (45C) penetrating the second upper insulating layer 39 are formed. The third via holes (45C) are formed, for example, by irradiating laser to the second upper insulating layer 39 from above. A wavelength of the laser used in forming the third via holes (45C) is longer than the wavelength of the laser used in forming the second via holes (45B) (to be described later). By forming the third via holes (45C) in the second upper insulating layer 39, the upper surfaces of the third outer pads (23C) are partially exposed.

Figure 9D:
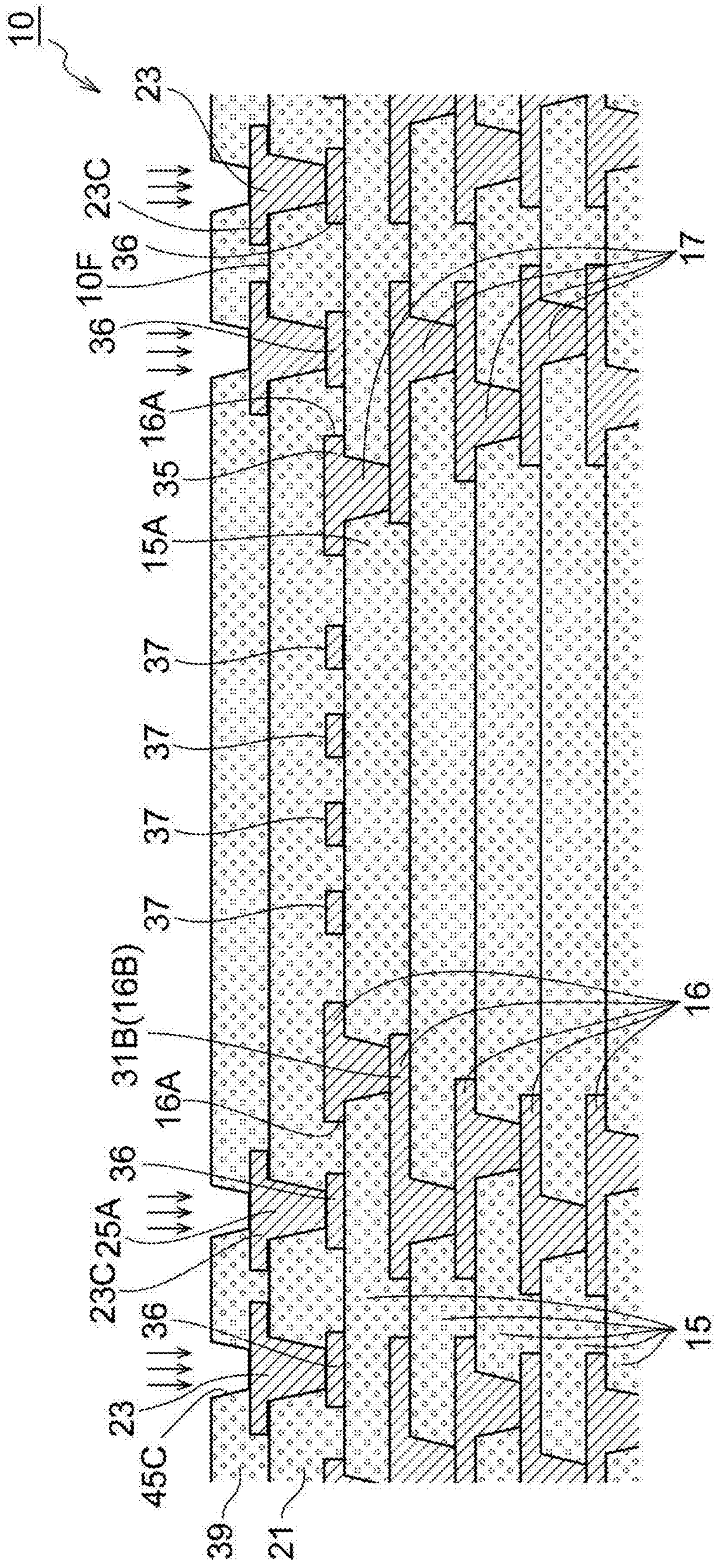
FIG. 9D is a partially enlarged cross-sectional view illustrating an example of a manufacturing process of a wiring substrate according to an embodiment of the present invention.

Next, as illustrated in FIG. 9D, the third via holes (45C) are subjected to a third desmear treatment for a certain processing time (T3). Resin residues generated due to the formation of the third via holes (45C) are completely or partially removed from the third via holes (45C) by the third desmear treatment. For the third desmear treatment, a method similar to that for the first desmear treatment and the second desmear treatment in the first embodiment, for example, a method such as a wet desmear treatment using an alkaline permanganate solution or a dry desmear treatment using a gas such as plasma is used. At this stage, since the second via holes (45B) have not been formed, the second via holes (45B) are not subjected to a desmear treatment.

Figure 9E:
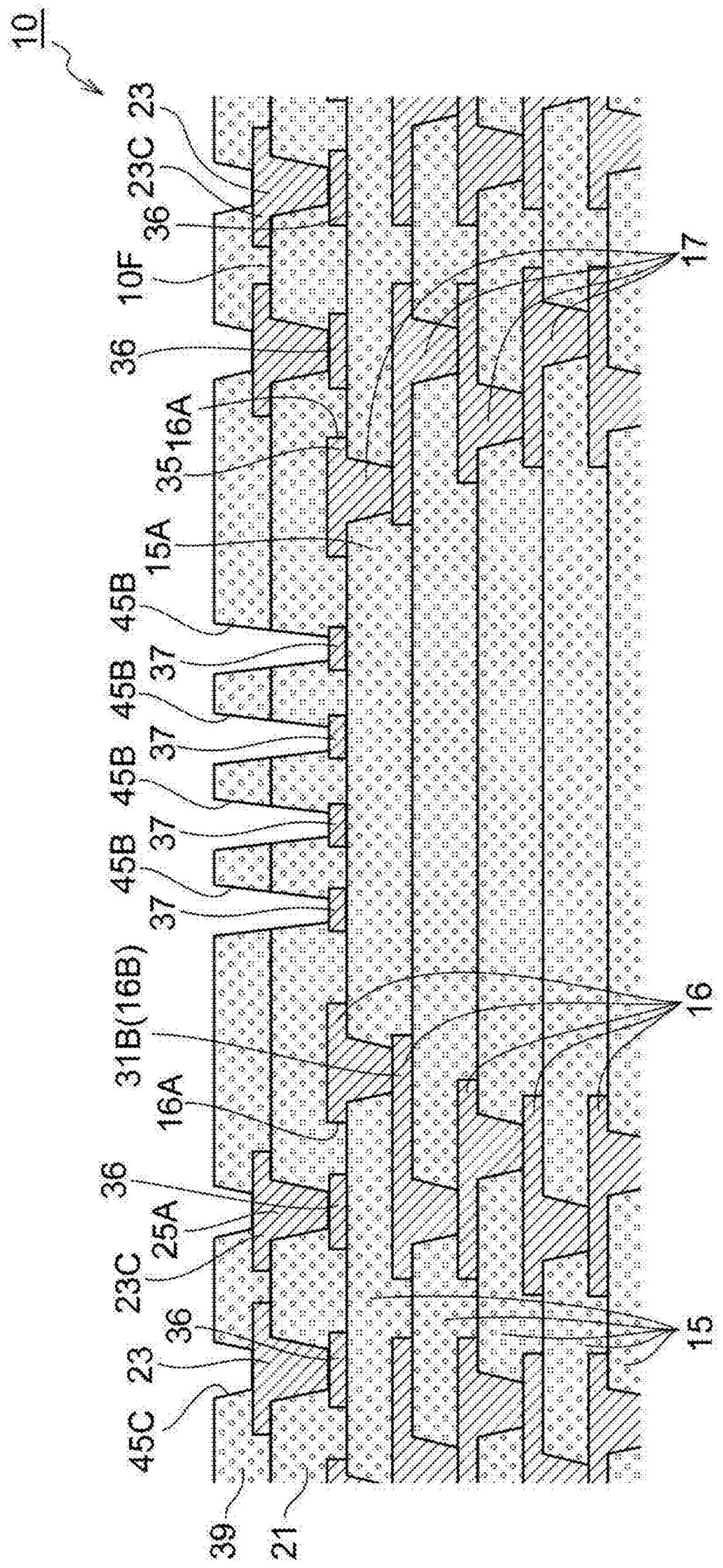
FIG. 9E is a partially enlarged cross-sectional view illustrating an example of a manufacturing process of a wiring substrate according to an embodiment of the present invention.

Next, as illustrated in FIG. 9E, the second via holes (45B) penetrating the outer build-up insulating layer 21 and the second upper insulating layer 39 are formed. In the second embodiment, the second via holes (45B) are formed by irradiating laser to the outer build-up insulating layer 21 and the second upper insulating layer 39 from above. Similar to the method for manufacturing the wiring substrate 100 of the first embodiment, the wavelength of the laser used in forming the second via holes (45B) is shorter than the wavelength of the laser used in forming the first via holes (45A). Further, the wavelength of the laser used in forming the second via holes (45B) is shorter than the wavelength of the laser used in forming the third via holes (45C). By forming the second via holes (45B) in the outer build-up insulating layer 21 and the second upper insulating layer 39, the upper surfaces of the second conductor pads 37 are partially exposed.

Figure 9F:
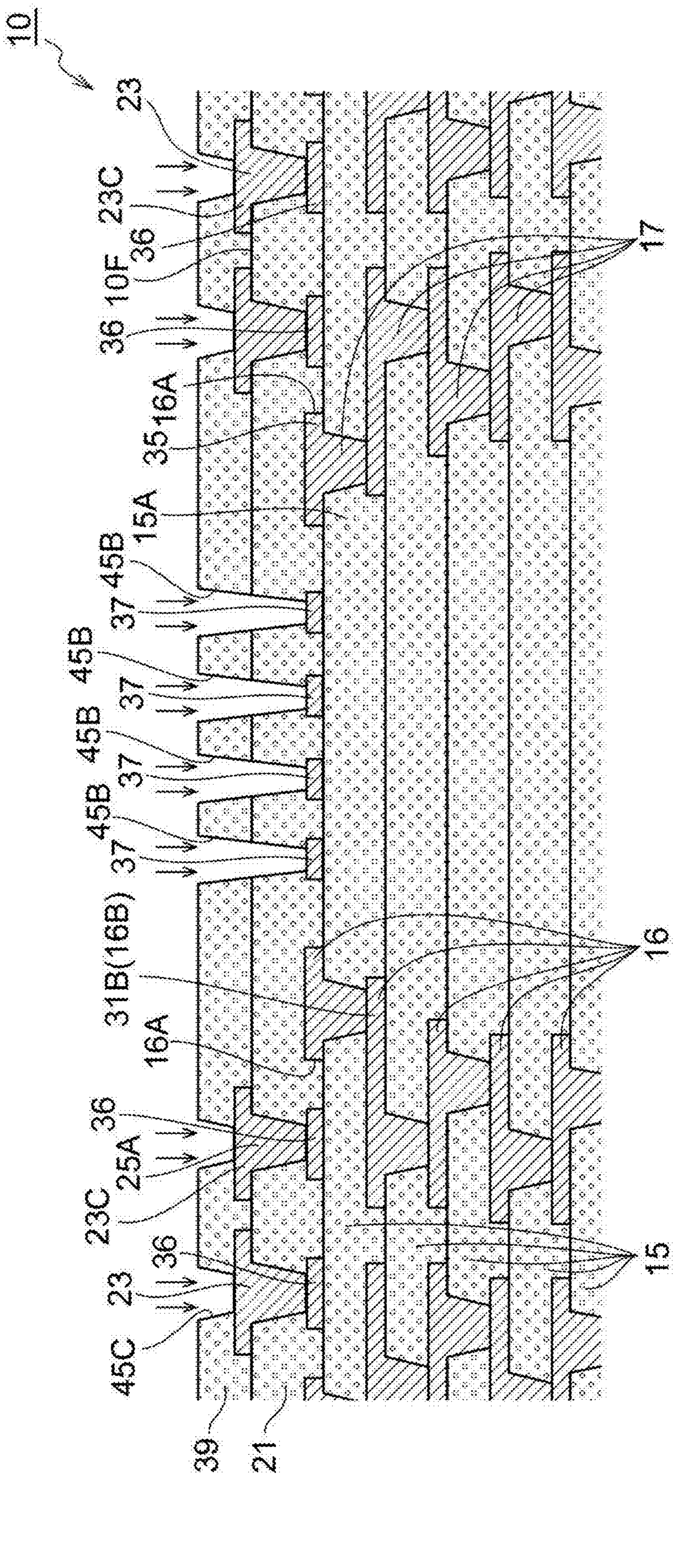
FIG. 9F is a partially enlarged cross-sectional view illustrating an example of a manufacturing process of a wiring substrate according to an embodiment of the present invention.

Next, as illustrated in FIG. 9F, the second via holes (45B) are subjected to a second desmear treatment for a certain processing time (T2). Resin residues generated due to the formation of the second via holes (45B) are completely or partially removed from the second via holes (45B) by the second desmear treatment. For the second desmear treatment, a method similar to that for the first desmear treatment, for example, a method such as a wet desmear treatment using an alkaline permanganate solution or a dry desmear treatment using a gas such as plasma is used. In the second embodiment, the processing time (T2) of the second desmear treatment is set shorter than the processing time (T3) of the third desmear treatment. When the second desmear treatment is performed, the third via holes (45C) are also subjected to a desmear treatment. In this case, the processing time of the desmear treatment for the second via holes (45B) is T2, whereas the total processing time of the desmear treatments for the third via holes (45C) is T2+T3. Therefore, the processing time (T2) of the desmear treatment for the second via holes (45B) is shorter than the total processing time (T2+T3) of the desmear treatments for the third via holes (45C).

Then, as illustrated in FIG. 8, the second via conductors (25B) are formed in the second via holes (45B), and the third via conductors (25C) are formed in the third via holes (45C). The Cu layer (41L) is formed at the same time as the formation of the second via conductors (25B) and the third via conductors (25C). Subsequently, the Ni layer (41M) and the Sn layer (41N) are formed, and the first surface plating layer 41 is formed on the first surface (10F) side of the main body substrate 10. Then, the resin protective film covering the second surface solder resist layer (29B) is removed, and the wiring substrate 200 is completed.

In the second embodiment, the processing time (T2) of the desmear treatment for the second via holes (45B) is shorter than the total processing time (T2+T3) of the desmear treatments for the third via holes (45C). Therefore, compared to the case where the processing time (T2) of the desmear treatment for the second via holes (45B) is equal to or longer than the processing time of the desmear treatment for the third via holes (45C), haloing between the second conductor pads 37 and the outer build-up insulating layer 21 above the second conductor pads 37 can be suppressed.

Figure 10:
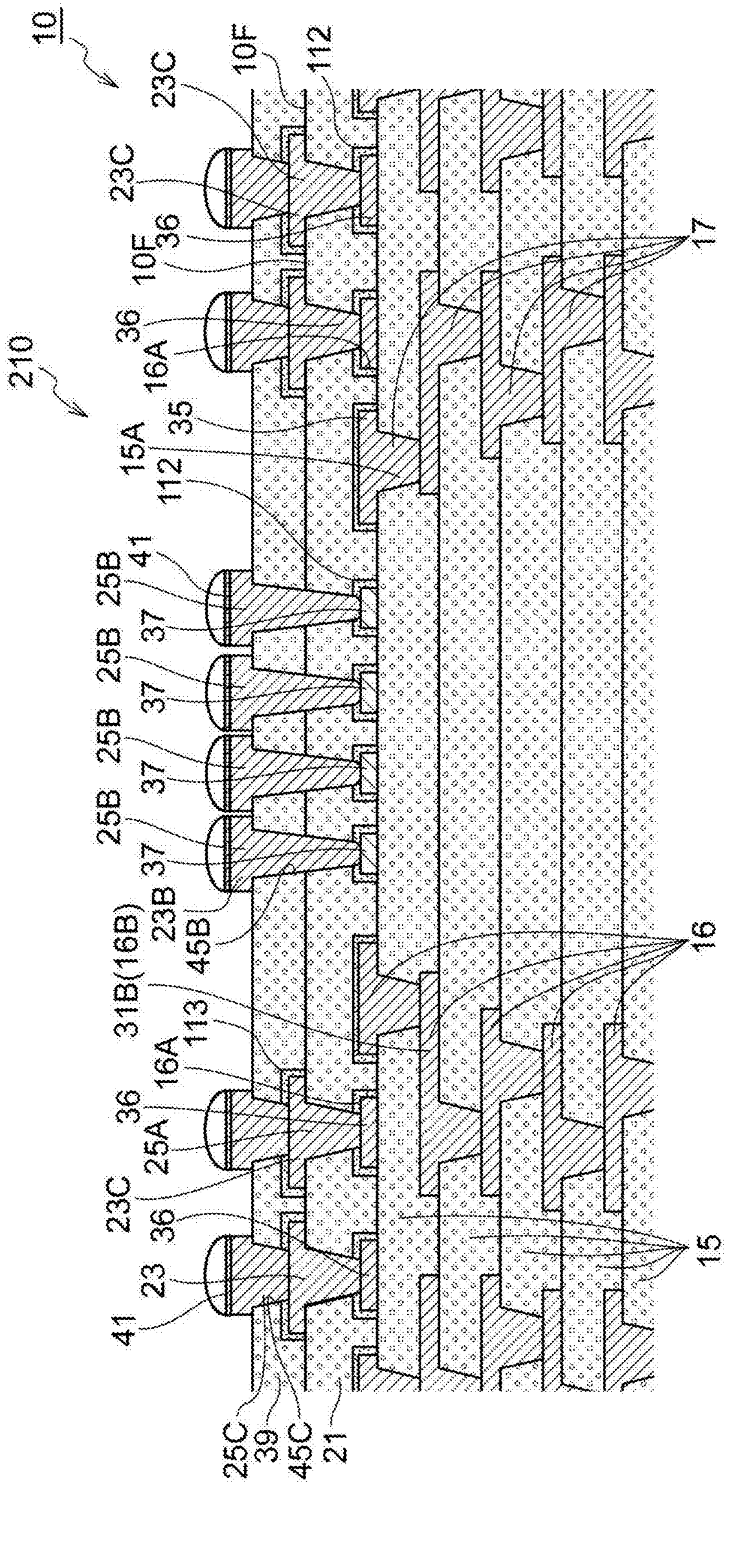
FIG. 10 is a partially enlarged cross-sectional view illustrating a modified example of a wiring substrate according to an embodiment of the present invention.

In the second embodiment, it is also possible to have a structure of a wiring substrate 210 of a modified example illustrated in FIG. 10.

In the wiring substrate 210 of the modified example of the second embodiment, the first conductor pads 36 and the second conductor pads 37 are covered the coating film 112, and further, the third outer pads (23C) are also covered by a coating film 113. Specifically, the coating film 112 covers the surfaces of the outer conductor circuit layer 35, the first conductor pads 36 and the second conductor pads 37 that face the outer build-up insulating layer 21. Further, the coating film 113 covers the surfaces of the third outer pads (23C) that face the second upper insulating layer 39.

The coating film 113 covering the third outer pads (23C) increases the adhesion between the third outer pads (23C) and the second upper insulating layer 39. The coating film 113 is formed of, for example, a material that can bind to both an organic material such as a resin forming the second upper insulating layer 39 and an inorganic material such as a metal forming the third outer pads (23C). The coating film 113 is formed of, for example, a material that contains both a reactive group capable of chemically bonding to an organic material and a reactive group capable of chemically bonding to an inorganic material. An example of a material of the coating film 113 is a silane coupling agent containing an azole silane compound such as a triazole compound. The material of the coating film 113 is not limited to a silane coupling agent as long as the material can increase the adhesion strength between the third outer pads (23C) and the second upper insulating layer 39 compared to the case where the second upper insulating layer 39 is directly formed on the third outer pads (23C). Compared to the case where the second upper insulating layer 39 is directly formed on the third outer pads (23C), the third outer pads (23C) adhere to the second upper insulating layer 39 with high strength due to the coating film 113.

Figure 11A:
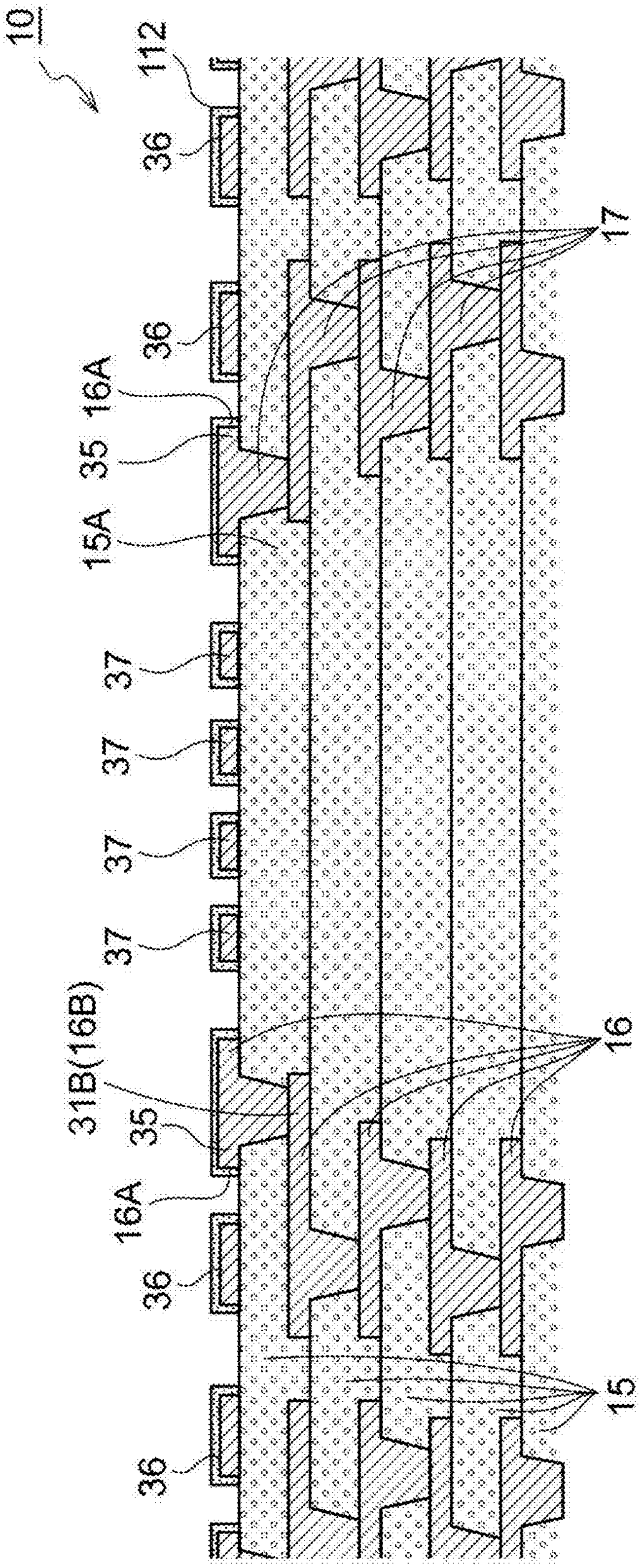
FIG. 11A is a partially enlarged cross-sectional view illustrating an example of a manufacturing process of a wiring substrate according to an embodiment of the present invention.

In a method for manufacturing the wiring substrate 210 of the modified example of the second embodiment, as illustrated in FIG. 11A, the coating film 112 is formed after the first conductor pads 36 and second conductor pads 37 are formed on the first build-up insulating layer (15A) (see FIGS. 4A and 4B) and before the outer build-up insulating layer 21 is formed (see FIG. 5A). Then, when the first via holes (45A) are formed in the outer build-up insulating layer 21, portions of the coating film 112 corresponding to the first via holes (45A) are removed. Similarly, when the second via holes (45B) are formed in the outer build-up insulating layer 21 and the second upper insulating layer 39, portions of the coating film 112 corresponding to the second via holes (45B) are removed.

Figure 11B:
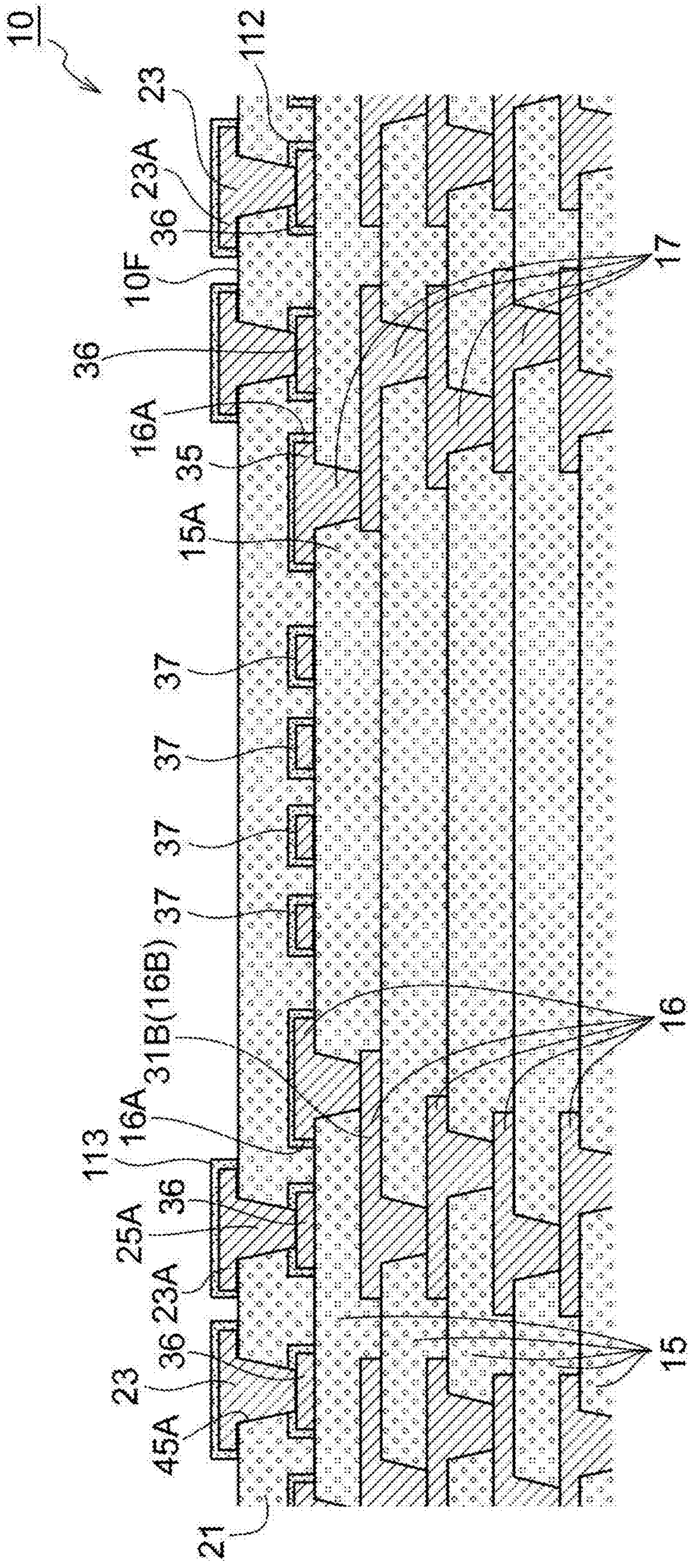
FIG. 11B is a partially enlarged cross-sectional view illustrating an example of a manufacturing process of a modified example of a wiring substrate according to an embodiment of the present invention.

On the other hand, as illustrated in FIG. 11B, the coating film 113 is formed after the third outer pads (23C) are formed on the outer build-up insulating layer 21 (see FIG. 9A) and before the second upper insulating layer 39 is formed (see FIG. 9B). Then, when the third via holes (45C) are formed in the second upper insulating layer 39, portions of the coating film 113 corresponding to the third via holes (45C) are removed.

A wiring substrate according to an embodiment of the present invention is not limited to those having the structures illustrated in the drawings and those having the structures, shapes, and materials exemplified in the present specification. As described above, the wiring substrate of the embodiment may have any laminated structure. For example, the wiring substrate of the embodiment may be a coreless substrate that does not include a core substrate. The wiring substrate of the embodiment may include any number of conductor layers and any number of insulating layers.

A method for manufacturing a wiring substrate according to an embodiment of the present invention is not limited to the method described with reference to the drawings. For example, the conductor layers may be formed using a full additive method. Each of the insulating layers may be formed using a resin in any form without being limited to a film-like resin. In the method for manufacturing the wiring substrate of the embodiment, it is also possible that any process other than the processes described above is added, or some of the processes described above are omitted.

Japanese Patent Application Laid-Open Publication No. 2016-58472 describes a method for manufacturing a wiring substrate, which includes: a main body substrate accommodating an interposer in a cavity; an outer build-up insulating layer formed on the main body substrate and the interposer; and via conductors formed in via formation holes penetrating the outer build-up insulating layer. In the method for manufacturing the wiring substrate, the via formation holes include first via formation holes that are formed on an outer side of the cavity when viewed from a thickness direction and second via formation holes that expose electrode terminals of the interposer and each have a smaller diameter than each of the first via formation holes. The first via formation holes are formed by laser processing, and the second via formation holes are formed using laser with a shorter wavelength than the laser used in forming the first via formation holes.

When manufacturing a wiring substrate with a structure in which multiple conductor pads formed on an insulating layer are further covered with an upper insulating layer, via holes for providing conductor vias in contact with a conductor layer are formed in the upper insulating layer. Then, after the formation of the via holes, a desmear treatment is performed to remove resin residues in the via holes. In the desmear treatment, a gap occurring between the conductor layer and the upper insulating layer may expand to between the insulating layer and the upper insulating layer, and the upper insulating layer may peel off from the insulating layer. In particular, in a wiring substrate having multiple conductor pads with different inter-pad distances, peeling is likely to occur in a portion where a distance between conductor layers is relatively short.

A method for manufacturing a wiring substrate according to an embodiment of the present invention includes: forming, on an upper surface of an insulating layer, multiple first conductor pads and multiple second conductor pads, the second conductor pads having an inter-pad distance shorter than an inter-pad distance of the first conductor pads; forming an upper insulating layer covering the upper surface of the insulating layer, the first conductor pads and the second conductor pads; forming, in the upper insulating layer, first via holes exposing the first conductor pads; performing a first desmear treatment to remove residues from the first via holes; forming, in the upper insulating layer, second via holes exposing the second conductor pads; performing a second desmear treatment to remove residues from the second via holes; forming first via conductors in the first via holes; and forming second via conductors in the second via holes, wherein the forming of the second via holes is performed after the performing of the first desmear treatment.

According to an embodiment of the present invention, when manufacturing a wiring substrate with a structure in which multiple conductor pads are formed on an insulating layer and the multiple conductor pads are covered with an upper insulating layer, even in a portion where an inter-pad distance of the conductor pads is short, peeling of the insulating layer from the upper insulating layer can be suppressed.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for manufacturing a wiring substrate, comprising:

forming, on a surface of an insulating layer, a plurality of first conductor pads and a plurality of second conductor pads having an inter-pad distance that is shorter than an inter-pad distance of the first conductor pads;

forming a second insulating layer on the surface of the insulating layer such that the second insulating layer covers the surface of the insulating layer, the first conductor pads and the second conductor pads;

forming a plurality of first via holes in the second insulating layer such that the first via holes expose the first conductor pads formed on the surface of the insulating layer, respectively;

applying a first desmear treatment to the second insulating layer such that residues are removed from the first via holes formed in the second insulating layer;

forming a plurality of second via holes in the second insulating layer after the first desmear treatment such that the second via holes expose the second conductor pads formed on the surface of the insulating layer;

applying a second desmear treatment to the second insulating layer such that residues are removed from the second via holes formed in the second insulating layer;

forming a plurality of first via conductors in the first via holes formed in the second insulating layer such that the first via conductors are formed on the first conductor pads, respectively; and forming a plurality of second via conductors in the second via holes formed in the second insulating layer such that the second via conductors are formed on the second conductor pads, respectively.

2. The method of claim 1, wherein the second desmear treatment is applied such that a processing time of the second desmear treatment is shorter than a processing time of the first desmear treatment.

3. The method of claim 2, wherein the first via conductors and the second via conductors are formed in the first via holes and the second via holes in a same process.

4. The method of claim 3, further comprising:

forming a coating film on the plurality of first conductor pads and the plurality of second conductor pads such that the coating film covers surfaces of the first conductor pads and the second conductor pads.

5. The method of claim 3, wherein the forming of the first via holes includes irradiating laser upon the second insulating layer such that irradiation of the laser forms the first via holes in the second insulating layer, and the forming of the second via holes includes irradiating laser upon the second insulating layer at a wavelength that is shorter than a wavelength of the laser for the forming of the first via holes such that the irradiation of the laser forms the second via holes in the second insulating layer.

6. The method of claim 2, further comprising:

forming a coating film on the plurality of first conductor pads and the plurality of second conductor pads such that the coating film covers surfaces of the first conductor pads and the second conductor pads.

7. The method of claim 2, wherein the forming of the first via holes includes irradiating laser upon the second insulating layer such that irradiation of the laser forms the first via holes in the second insulating layer, and the forming of the second via holes includes irradiating laser upon the second insulating layer at a wavelength that is shorter than a wavelength of the laser for the forming of the first via holes such that the irradiation of the laser forms the second via holes in the second insulating layer.

8. The method of claim 1, wherein the first via conductors and the second via conductors are formed in the first via holes and the second via holes in a same process.

9. The method of claim 8, further comprising:

forming a coating film on the plurality of first conductor pads and the plurality of second conductor pads such that the coating film covers surfaces of the first conductor pads and the second conductor pads.

10. The method of claim 8, wherein the forming of the first via holes includes irradiating laser upon the second insulating layer such that irradiation of the laser forms the first via holes in the second insulating layer, and the forming of the second via holes includes irradiating laser upon the second insulating layer at a wavelength that is shorter than a wavelength of the laser for the forming of the first via holes such that the irradiation of the laser forms the second via holes in the second insulating layer.

11. The method of claim 1, further comprising:

forming a coating film on the plurality of first conductor pads and the plurality of second conductor pads such that the coating film covers surfaces of the first conductor pads and the second conductor pads.

12. The method of claim 11, wherein the forming of the first via holes includes irradiating laser upon the second insulating layer such that irradiation of the laser forms the first via holes in the second insulating layer, and the forming of the second via holes includes irradiating laser upon the second insulating layer at a wavelength that is shorter than a wavelength of the laser for the forming of the first via holes such that the irradiation of the laser forms the second via holes in the second insulating layer.

13. The method of claim 1, wherein the forming of the first via holes includes irradiating laser upon the second insulating layer such that irradiation of the laser forms the first via holes in the second insulating layer, and the forming of the second via holes includes irradiating laser upon the second insulating layer at a wavelength that is shorter than a wavelength of the laser for the forming of the first via holes such that the irradiation of the laser forms the second via holes in the second insulating layer.

14. A method for manufacturing a wiring substrate, comprising:

forming, on a surface of an insulating layer, a plurality of first conductor pads and a plurality of second conductor pads having an inter-pad distance that is shorter than an inter-pad distance of the first conductor pads;

forming a second insulating layer on the surface of the insulating layer such that the second insulating layer covers the surface of the insulating layer, the first conductor pads and the second conductor pads;

forming a plurality of first via holes in the second insulating layer such that the first via holes expose the first conductor pads formed on the surface of the insulating layer, respectively;

applying a first desmear treatment to the second insulating layer such that residues are removed from the first via holes formed in the second insulating layer;

forming a plurality of first via conductors in the first via holes formed in the second insulating layer such that the first via conductors are formed on the first conductor pads, respectively;

forming a plurality of third conductor pads on a surface of the second insulating layer such that the third conductor pads connect to the first via conductors, respectively;

forming a third insulating layer on the second insulating layer such that the third insulating layer covers the surface of the second insulating layer and the third conductor pads;

forming a plurality of third via holes in the third insulating layer such that the third via holes expose the third conductor pads formed on the surface of the second insulating layer, respectively;

applying a third desmear treatment to the third insulating layer such that residues are removed from the third via holes formed in the third insulating layer;

forming a plurality of second via holes in the second insulating layer and the third insulating layer such that the second via holes expose the second conductor pads formed on the surface of the insulating layer, respectively;

applying a second desmear treatment to the second insulating layer and the third insulating layer such that a processing time of the second desmear treatment is shorter than a processing time of the third desmear treatment and that residues are removed from the second via holes formed in the second insulating layer and the third insulating layer;

forming a plurality of third via conductors in the third via holes formed in the third insulating layer such that the third via conductors are formed on the third conductor pads, respectively; and forming a plurality of second via conductors in the second via holes formed in the second insulating layer and the third insulating layer such that the second via conductors are formed on the second conductor pads, respectively.

15. The method of claim 14, wherein the second via conductors and the third via conductors are formed in the second via holes and the third via holes in a same process.

16. The method of claim 15, further comprising:

forming a coating film on the plurality of second conductor pads and the plurality of third conductor pads such that the coating film covers surfaces of the second conductor pads and the third conductor pads.

17. The method of claim 15, wherein the forming of the third via holes includes irradiating laser upon the third insulating layer such that irradiation of the laser forms the third via holes in the third insulating layer, and the forming of the second via holes includes irradiating laser upon the second and third insulating layers at a wavelength that is shorter than a wavelength of the laser for the forming of the third via holes such that the irradiation of the laser forms the second via holes in the second and third insulating layers.

18. The method of claim 14, further comprising:

forming a coating film on the plurality of second conductor pads and the plurality of third conductor pads such that the coating film covers surfaces of the second conductor pads and the third conductor pads.

19. The method of claim 18, wherein the forming of the third via holes includes irradiating laser upon the third insulating layer such that irradiation of the laser forms the third via holes in the third insulating layer, and the forming of the second via holes includes irradiating laser upon the second and third insulating layers at a wavelength that is shorter than a wavelength of the laser for the forming of the third via holes such that the irradiation of the laser forms the second via holes in the second and third insulating layers.

20. The method of claim 14, wherein the forming of the third via holes includes irradiating laser upon the third insulating layer such that irradiation of the laser forms the third via holes in the third insulating layer, and the forming of the second via holes includes irradiating laser upon the second and third insulating layers at a wavelength that is shorter than a wavelength of the laser for the forming of the third via holes such that the irradiation of the laser forms the second via holes in the second and third insulating layers.

* * * * *